(12) United States Patent
Pschirer et al.

(10) Patent No.: US 8,563,855 B2
(45) Date of Patent: Oct. 22, 2013

(54) TANDEM PHOTOVOLTAIC CELL

(75) Inventors: Neil Gregory Pschirer, Mainz (DE);
Felix Eickemeyer, Mannheim (DE); Jan Schoeneboom, Mannheim (DE); Jae Hyung Hwang, Mannheim (DE); Martin Karlsson, Mannheim (DE); Ingmar Bruder, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 459 days.

(21) Appl. No.: 12/670,036

(22) PCT Filed: Jul. 22, 2008

(86) PCT No.: PCT/EP2008/059565
§ 371 (c)(1),
(2), (4) Date: Jan. 21, 2010

(87) PCT Pub. No.: WO2009/013282
PCT Pub. Date: Jan. 29, 2009

(65) Prior Publication Data
US 2010/0282309 A1 Nov. 11, 2010

(30) Foreign Application Priority Data

Jul. 23, 2007 (EP) .................................... 07112948

(51) Int. Cl.
*H01L 31/02* (2006.01)
*H01L 31/0256* (2006.01)
*H01L 31/0264* (2006.01)

(52) U.S. Cl.
USPC ............ 136/263; 136/265; 136/262; 136/252; 438/85; 438/82; 438/95; 438/57; 257/E31.004; 257/E31.003

(58) Field of Classification Search
USPC ........ 136/263, 265, 262, 252; 438/85, 82, 95, 438/57; 257/E31.004, E31.003
See application file for complete search history.

(56) References Cited

U.S. PATENT DOCUMENTS

| 4,927,721 A | 5/1990 | Gratzel et al. |
| 5,350,644 A | 9/1994 | Graetzel et al. |

(Continued)

FOREIGN PATENT DOCUMENTS

| DE | 10 2005 053 995 A1 | 5/2007 |
| EP | 1 176 646 A1 | 1/2002 |

(Continued)

OTHER PUBLICATIONS

U.S. Appl. No. 13/322,210, filed Nov. 23, 2011, Sundarraj, et al.

(Continued)

*Primary Examiner* — Golam Mowla
(74) *Attorney, Agent, or Firm* — Oblon, Spivak, McClelland, Maier & Neustadt, L.L.P.

(57) ABSTRACT

A photovoltaic element (110) for converting electromagnetic radiation into electrical energy is provided, which has a tandem cell structure. The tandem cell structure comprises the following:
a dye solar cell (126) having a first electrode (118), an n-type semiconducting metal oxide (120), a dye (122) absorbing electromagnetic radiation in a first spectral range and a solid p-type semiconductor (124); and
an organic solar cell (130) having an acceptor material (132) and a donor material (134), the acceptor material (132) and/or the donor material (134) comprising an organic material, the organic solar cell (130) furthermore comprising a second electrode (138) on an opposite side from the dye solar cell (126), and the organic solar cell being configured to absorb electromagnetic radiation in a second spectral range, which is at least partially different to the first spectral range,
the first electrode (118) and/or the second electrode (138) being at least partially transparent for the electromagnetic radiation.

35 Claims, 10 Drawing Sheets

(56) References Cited

U.S. PATENT DOCUMENTS

| | | | |
|---|---|---|---|
| 6,359,211 | B1 | 3/2002 | Spitler et al. |
| 7,375,370 | B2* | 5/2008 | Forrest et al. ............... 257/40 |
| 2005/0061364 | A1* | 3/2005 | Peumans et al. ............ 136/263 |
| 2005/0098207 | A1* | 5/2005 | Matsumoto et al. ......... 136/263 |
| 2006/0032529 | A1* | 2/2006 | Rand et al. .................. 136/263 |
| 2006/0049397 | A1 | 3/2006 | Pfeiffer et al. |
| 2006/0060239 | A1* | 3/2006 | Peumans et al. ............ 136/263 |
| 2007/0062576 | A1 | 3/2007 | Duerr et al. |
| 2007/0272296 | A1 | 11/2007 | Brabec et al. |
| 2008/0167467 | A1 | 7/2008 | Konemann et al. |
| 2008/0188660 | A1 | 8/2008 | Pschirer et al. |
| 2008/0255357 | A1 | 10/2008 | Pschirer et al. |
| 2008/0269482 | A1 | 10/2008 | Pschirer et al. |

FOREIGN PATENT DOCUMENTS

| | | |
|---|---|---|
| EP | 1 724 838 A1 | 11/2006 |
| JP | 10-189065 | 7/1998 |
| JP | 10-334954 | 12/1998 |
| JP | 2000-90989 A | 3/2000 |
| JP | 2000-100484 | 4/2000 |
| JP | 2000-243463 | 9/2000 |
| JP | 2001-93589 | 4/2001 |
| JP | 2002-231324 A | 8/2002 |
| JP | 2006-147280 | 6/2006 |
| JP | 2007-113365 A | 5/2007 |
| WO | WO 02/101838 A1 | 12/2002 |
| WO | WO 2004/112161 A2 | 12/2004 |
| WO | WO 2004/112161 A3 | 12/2004 |
| WO | WO 2005/076383 A2 | 8/2005 |
| WO | WO 2005/076383 A3 | 8/2005 |
| WO | WO 2006/017530 A1 | 2/2006 |
| WO | WO 2006/111511 A1 | 10/2006 |
| WO | WO 2006/117383 A1 | 11/2006 |
| WO | WO 2007/006717 A1 | 1/2007 |
| WO | WO 2007/054470 A1 | 5/2007 |
| WO | WO 2007/076427 A2 | 7/2007 |

OTHER PUBLICATIONS

U.S. Appl. No. 13/119,192, filed Mar. 16, 2011, Koenemann, et al.
U.S. Appl. No. 12/668,975, filed Jan. 13, 2010, Pschirer, et al.
U.S. Appl. No. 12/738,947, filed Apr. 20, 2010, Koenemann, et al.
Michael Grätzel, "Dye-Sensitized Solar Cells", Journal of Photochemistry and Photobiology C: Photochemistry Reviews, 4, 2003, pp. 145-153.
Yasuo Chiba, et al., "Dye-Sensitized Solar Cells with Conversion Efficiency of 11.1%", Japanese Journal of Applied Physics, vol. 45, No. 25, 2006, pp. L638-L640.
Henry J. Snaith, et al., "Ion-Coordinating Sensitizer in Solid-State Hybrid Solar Cells", Angew. Chem. Int. Ed., 44, 2005, pp. 6413-6417.
Jessica Krüger, et al., "High Efficiency Solid-State Photovoltaic Device Due to Inhibition of Interface Charge Recombination", Applied Physics Letters, vol. 79, No. 13, Sep. 24, 2001, pp. 2085-2087.
Lukas Schmidt-Mende, et al., "Organic Dye for Highly Efficient Solid-State Dye-Sensitized Solar Cells", Advanced Materials, 17, No. 7, Apr. 4, 2005, pp. 813-815.
K. Peter, et al., "Dual-Functional Materials for Interface Modifications in Solid-State Dye-Sensitised $TiO_2$ Solar Cells", Applied Physics A, Materials Science & Processing, 2004, pp. 65-71.
Jessica E. Kroeze, et al., "Parameters Influencing Charge Separation in Solid-State Dye-Sensitized Solar Cells Using Novel Hole Conductors", Advanced Functional Materials, 16, 2006, pp. 1832-1838.
David Kearns, et al., "Photovoltaic Effect and Photoconductivity in Laminated Organic Systems", The Journal of Chemical Physics, vol. 29, 1958, pp. 950-951.
Wendy U. Huynh, et al., "Hybrid Nanorod-Polymer Solar Cells", Science, vol. 295, Mar. 29, 2002, pp. 2425-2427.
C. W. Tang, "Two-layer Organic Photovoltaic Cell", Applied Physics Letters, vol. 48, No. 2, Jan. 13, 1986, pp. 183-185.
Fan Yang, et al., "Controlled Growth of Molecular Bulk Heterojunction Photovoltaic Cell", Nature Materials, vol. 4, Jan. 2005, pp. 37-41.
Kristin L. Mutolo, et al., "Enhanced Open-Circuit Voltage in Subphthalocyanine/$C_{60}$ Organic Photovoltaic Cells", J. Am. Chem. Soc., vol. 128, No. 25, 2006, pp. 8108-8109.
Kerstin Schulze, et al., "Efficient Vacuum-Deposited Organic Solar Cells Based on a New Low-Bandgap Oligothiophene and Fullerene $C_{60}$", Advanced Materials, 18, 2006, pp. 2872-2875.
Kerstin Schulze, et al., "Efficient Heterojunction Organic Solar Cells with High Photovoltage Containing a Low Gap Oligothiophene Derivative", Organic Optoelectronics and Photonics II, Proceedings of SPIE, vol. 6192, pp. 61920C-1 to 61920C-6, Apr. 20, 2006.
Yan Shao, et al., "Efficient Organic Heterojunction Photovoltaic Cells Based on Triplet Materials", Advanced Materials, 17, 2005, pp. 2841-2844.
L. Schmidt-Mende, et al., "Self-Organized Discotic Liquid Crystals for High-Efficiency Organic Photovoltaics", Science, vol. 293, Aug. 10, 2001, pp. 1119-1122.
Michele Maggini, et al., "Solar Cells Based on a Fullerene-Azothiophene Dyad", Chem. Commun., 2002, pp. 2028-2029.
Sean E. Shaheen, et al., "2.5% Efficient Organic Plastic Solar Cells", Applied Physics Letters, vol. 78, No. 6, Feb. 5, 2001, pp. 841-843.
Dr. Dieter Meissner, "Solarzellen", Friedr. Vieweg & Sohn Verlagsgestellschaft mbH, 1993, pp. 129-136.
Martin A. Green, et al., "Solar Cell Efficiency Tables (Version 28)", Progress in Photovoltaics: Research and Applications, 14, 2006, pp. 455-461.
Afshin Hadipour, et al., "Solution-Processed Organic Tandem Solar Cells", Advanced Functional Materials, 16, 2006, pp. 1897-1903.
Jiangeng Xue, et al., "Asymmetric Tandem Organic Photovoltaic Cells with Hybrid Planar-Mixed Molecular Heterojunctions", Applied Physics Letters, vol. 85, No. 23, Dec. 6, 2004, pp. 5757-5759.
Kuwat Triyana, et al., "Effects of Different Materials Used for Internal Floating Electrode on the Photovoltaic Properties of Tandem Type Organic Solar Cell", Japanese Journal of Applied Physics, vol. 43, No. 4B, 2004, pp. 2352-2356.
Masahiro Hiramoto, et al., "Effects of Thin Gold Interstitial-layer on the Photovoltaic Properties of Tandem Organic Solar Cell", Chemistry Letters, 1990, pp. 327-330.
M. Dürr, et al., "Tandem Dye-Sensitzed Solar Cell for Improved Power Conversion Efficiencies", Applied Physics Letters, vol. 84, No. 17, Apr. 26, 2004, pp. 3397-3399.
Jianjun He, et al., "Dye-Sensitized Nanostructured Tandem Cell-First Demonstrated Cell with a Dye-Sensitized Photocathode", Solar Energy Materials & Solar Cells, vol. 62, 2000, pp. 265-273.
Akihiko Nakasa, et al., "A High Voltage Dye-Sensitized Solar Cell using a Nanoporous NiO Photocathode", Chemistry Letters, vol. 34, No. 4, 2005, pp. 500-501.
Bin Peng, et al., "Systematic Investigation of the Role of Compact $TiO_2$ Layer in Solid State Dye-Sensitized $TiO_2$ Solar Cells", Coordination Chemistry Reviews, 248, 2004, pp. 1479-1489.
Pieter G. Schouten, et al., "Charge Migration in Supramolecular Stacks of Peripherally Substituted Porphyrins", Nature, vol. 353, Oct. 24, 1991, pp. 736-740.
U. Bach, et al., "Solid-State Dye-Sensitized Mesoporous $TiO_2$ Solar Cells with High Photon-to-Electron Conversion Efficiencies", Nature, vol. 395, Oct. 8, 1998, pp. 583-585.
Suzanne Ferrere, et al., "New Perylenes for Dye Sensitization of $TiO_2$" New J. Chem., 26, 2002, pp. 1155-1160.
V. P. S. Perera, et al., "Dye-Sensitized Solid-State Photovoltaic Cells Based on Dye Multilayer—Semiconductor Nanostructures", J. Phys. Chem. B., 107, 2003, pp. 13758-13761.
G. R. A. Kumara, et al., "Fabrication of Dye-Sensitized Solar Cells Using Triethylamine Hydrothiocyanate as a CuI Crystal Growth Inhibitor", Langmuir, 18, 2002, pp. 10493-10495.
Tobat P. I. Saragi, et al., "Comparison of Charge-Carrier Transport in Thin Films of Spiro-Linked Compounds and Their Corresponding Parent Compounds", Advanced Functional Materials, 16, 2006, pp. 966-974.

(56) References Cited

OTHER PUBLICATIONS

Barry P. Rand, et al., "Long-Range Absorption Enhancement in Organic Tandem Thin-Film Solar Cells Containing Silver Nanoclusters", Journal of Applied Physics, vol. 96, No. 12, Dec. 15, 2004, 7519-7526.

Leif A. A. Pettersson, et al., "Modeling Photocurrent Action Spectra of Photovoltaic Devices Based on Organic Thin Films", Journal of Applied Physics, vol. 86, No. 1, Jul. 1, 1999, pp. 487-496.

Fabian Nolde, et al., "Synthesis and Self-Organization of Core-Extended Perylene Tetracarboxdiimides with Branched Alkyl Substituents", Chem. Mater., vol. 18, 2006, pp. 3715-3725.

Eva M. García-Frutos, et al., "Unusual Mesomorphic Behaviour of an Ethynyl-Substituted Phthalocyanine", Chem. Commun., 2006, pp. 3107-3109.

David Mühlbacher, et al., "High Photovoltaic Performance of a Low-Bandgap Polymer", Advanced Materials, 18, 2006, pp. 2884-2889.

Miguel Carrasco-Orozco, et al., "New Photovoltaic Concept: Liquid-Crystal Solar Cells Using a Nematic Gel Template", Advanced Materials, 18, 2006, pp. 1754-1758.

Lukas Schmidt-Mende, et al., "Efficiency Improvement in Solid-State-Dye-Sensitized Photovoltaics with an Amphiphilic Ruthenium-Dye", Applied Physics Letters, 86, 2005, pp. 013504-1 to 013504-3.

Seigo Ito, et al., "High-Efficiency Organic-Dye-Sensitized Solar Cells Controlled by Nanocrystalline-$TiO_2$ Electrode Thickness", Advanced Materials, 18, 2006, pp. 1202-1205.

Office Action issued Apr. 22, 2013, in Japanese Patent Application No. 2010-517385 (submitting English translation only).

* cited by examiner

TANDEM PHOTOVOLTAIC CELL

The invention relates to a photovoltaic element having a tandem cell structure according to the preamble of claim 1. Such photovoltaic elements are used in order to convert electromagnetic radiation, particularly sunlight, into electrical energy.

The direction conversion of solar energy into electrical energy in solar cells is generally based on the so-called "internal photoeffect" of a semiconductor material, i.e. the generation of electron-hole pairs by absorption of photons and separation of the negative and positive charge carriers at a p-n junction or a Schottky contact. A photovoltage is thereby generated which, in an external circuit, can induce a photocurrent through which the solar cell delivers its power.

The semiconductor can in this case generally absorb only those photons that have an energy which is greater than its bandgap. The size of the semiconductor bandgap therefore determines the proportion of sunlight which can be converted into electrical energy.

Solar cells which are based on crystalline silicon were already produced in the 1950s. The technology was at that time promoted by use in solar satellites. Although solar cells based on silicon now dominate the market on the ground, this technology still remains cost-intensive. Attempts are therefore being made to develop new approaches, which are more economical. Some of these approaches, which represent the basis of the present invention, will be outlined below.

Dye Solar Cells

The dye solar cell (DSC) is to date one of the most efficient alternative solar cell technologies. In a liquid variant of this technology, efficiencies of up to 11% are currently achieved (see for example Grätzel M. et al., J. Photochem. Photobio. C, 2003, 4, 145; Chiba et al., Japanese Journal of Appl. Phys., 2006, 45, L638-L640).

Solar cells constructed as single elements, of which there are now many variants, generally comprise two electrodes at least one of which is transparent. The two electrodes are referred to according to their function as the "working electrode" (or "anode", generation of electrons) and "back electrode" (or "cathode"). An n-type conducting metal oxide is generally applied on the working electrode or in its vicinity, for example an approximately 10-20 μm thick nanoporous layer of titanium dioxide ($TiO_2$). Adsorbed on the surface of this, there is conventionally a monolayer of a light-sensitive dye (for example a ruthenium complex) which can be converted into an excited state by light absorption. There is often a catalytic layer a few μm thick, for example of platinum, on or at the back electrode. The region between the two electrodes is filled with a redox electrolyte, for example a solution of iodine ($I_2$) and potassium iodide (KI).

The function of the dye solar cell is based on light being absorbed by the dye. Electrons are transferred from the excited dye to the n-type semiconducting metal oxide semiconductor, where they migrate to the anode, while the electrolyte ensures charge equilibration via the cathode. The n-type semiconducting metal oxide, the dye and the electrolyte are thus the essential components of the dye solar cell.

In many cases, however, the dye solar cell made with liquid electrolyte suffers from suboptimal sealing, which can lead to stability problems. The liquid electrolyte may nevertheless be replaced by a solid p-type semiconductor. The efficiency of the solid variant of the dye solar cell is currently about 4.6-4.7% (Snaith, H., Angew. Chem. Int. Ed., 2005, 44, 6413-6417).

Various inorganic p-type semiconductors, such as CuI, $CuBr.3(S(C_4H_9)_2)$ or CuSCN, have to date been used in solid dye solar cells. In nature there is also the Cu(I) enzyme plastocyanine, which reduces the oxidized chlorophyll dimer again in photosystem I. Such p-type semiconductors can be processed by at least three different methods, namely: from a solution, by electrodeposition or by laser deposition.

In practice, however, this may sometimes entail problems with the stability of the p-type semiconductors, which are due in particular to excessively large semiconductor crystals and poor contact with the dye. One way of avoiding this involves a CuI solution in an organic solvent, with the addition of an ionic liquid as a crystallization inhibitor. Various crystallization inhibitors may be used for this (usually SCN salts), and efficiencies of up to 3.75% are achieved. Another group uses a nanoporous $TiO_2$ layer covered with ZnO, in conjunction with CuI and 1-methyl-3-ethylimidazolium thiocyanate (MEISCN). These dye solar cells exhibit an efficiency of 3.8%. When using MgO-covered $TiO_2$ and CuI (as a p-type conductor) with triethyl amine hydrothiocyanate (as a crystallization inhibitor), efficiencies of up to 4.7% are achieved. CuSCN from a solution can also be used as a solid p-type semiconductor, and exhibits an efficiency of about 2%. Electrochemical deposition should allow better penetration into the mesoporous pores, if the p-type semiconductor can be deposited at negative potentials. Solid dye solar cells deliver efficiencies of 1.5% with this method, although only about 12% of the incident light is generally absorbed owing to a relatively thin ZnO layer. Lastly, relatively small grains are produced by laser deposition, which leads to a very good short circuit current $I_{SC}$ of about 12.2 mA/cm$^2$ despite an approximately 10 micrometer thick $TiO_2$ layer, and an efficiency of about 2.8% for an active surface area of about 1 cm$^2$.

Organic polymers have also already been used as solid p-type semiconductors. Examples of these include polypyrrole, poly(3,4-ethylene dioxythiophene), carbazole-based polymers, polyaniline, poly(4-undecyl-2,2'-bithiophene), poly(3-octylthiophene), poly(triphenyl diamine) and poly(N-vinyl carbazole). In the case of poly(N-vinyl carbazole), the efficiencies reach 2%. An in-situ polymerized PEDOT (poly (3,4-ethylene di-oxythiophene) has also shown an efficiency of 0.53%. The polymers described here are typically used not in a pure form, but with additives.

Low molecular weight organic p-type semiconductors may also be employed. The first use of a low molecular weight organic p-type semiconductor in solid dye solar cells replaced the liquid electrolyte with a vapor-deposited layer of triphenyl amine (TPD). The use of the organic compound 2,2'7, 7'-tetrakis(N,N-di-p-methoxyphenyl amine)-9,9'-spirobifluorene (spiro-MeOTAD) in dye solar cells was reported in 1998. It can be introduced from a solution and has a relatively high glass temperature, which prevents undesirable crystallization and poor contact with the dye. The methoxy groups adjust the oxidation potential of spiro-MeOTAD so that the Ru complex can be regenerated efficiently. Using spiro-MeOTAD on its own as a p-type conductor has given a maximum IPCE (incident photon to current conversion efficiency) of 5%. When $N(PhBr)_3SbCl_6$ (as a dopant) and $Li[(CF_3SO_2)_2N]$ were used in conjunction, the IPCE rose to 33% and the efficiency was 0.74%. The efficiency could be increased to 2.56% by using tert-butyl pyridine as a solid p-type semiconductor, the open circuit voltage ($V_{oc}$) being about 910 mV and the short circuit current $I_{SC}$ about 5 mA for an active surface area of about 1.07 cm$^2$ (see Kruger et al., Appl. Phys. Lett., 2001, 79, 2085). Dyes which achieved a better coverage of the $TiO_2$ layer, and which present good wetting on spiro-MeOTAD, exhibit efficiencies of more than 4%. Even better efficiencies (about 4.6%) were reported when the ruthenium complex was provided with oxyethylene side chains.

Adv. Mater. 17, pp. 813-815 (2005) proposes an indoline dye for dye solar cells with spirobifluorenes as an amorphous organic p-type conductor. This organic dye, which has an extinction coefficient four times higher than that of a ruthenium complex, exhibits a high efficiency (4.1% in sun) in solid dye solar cells.

A concept has furthermore been proposed in which polymeric p-type semiconductors are bound directly to a Ru dye (Peter, K., Appl. Phys. A 2004, 79, 65).

Durrant et al., Adv. Munc. Mater. 2006, 16, 1832-1838 describes that in many cases the photocurrent is directly dependent on the yield at the hole transit from the oxidized dye to the solid p-type semiconductor. This depends on two factors: first on the extent of penetration of the p-type conductor into the oxide pores and secondly on the thermodynamic driving force for the charge transfer (i.e. in particular the free enthalpy difference $\Delta G$ between the dye and the p-type conductor).

One disadvantage of dye solar cells is that the fraction of light which the dye can use is restricted by the energy difference between the Fermi energies of the n-type and p-type conductors being used. The photovoltage is also limited by this difference. Furthermore, owing to the required charge transport, dye solar cells generally have to be made comparatively thin (for example 1-2.5 micrometers) so that the utilization of the incident light is generally not optimal.

Organic Solar Cells

Photovoltaic elements which are based on a p-n junction, in which some or even all of the photoactive materials are organic, have been known for almost 50 years (see for example Kearns, K, Calvin, M., J., Chem. Phys. 1958, 29, 950-951). Such elements are designed so that at least one of the semiconductors (n-type semiconductor and/or p-type semiconductor) absorbs a photon, the resulting exciton being transported to the p-n junction and one or both of the two charges being transported from there to the electrode.

Organic solar cells may be composed of low molecular weight compounds (also referred to below as "low molecular weight cells"), polymers (also referred to below as "polymer cells"), oligomers or combinations of a few or more of these materials. Organic solar cells usually comprise an acceptor material in which the n-type charge transport (electron transport) dominates and which therefore represents the organic analog of an n-type semiconductor, as well as at least one donor material in which the p-type charge transport (hole transport) dominates and which therefore represents the organic analog of a p-type semiconductor. As an alternative or in addition, inorganic nanoparticles may also be used as acceptors (see for example Alivisatos A., Science, 2002, 295, 2425-2427).

For the purpose of this description, the multiplicity of organic photovoltaic concepts may be categorized according to processing methods. The materials are typically applied in a vacuum (for example by means of physical vapor deposition, PVD, chemical vapor deposition, CVD, molecular beam epitaxy or other methods or method combinations) and/or deposited from a solution (for example by spin coating, printing or other wet chemical technologies). There are also hybrids of these cell types and deposition methods, for example cells with low molecular weight layers applied in a vacuum and polymeric layers applied wet-chemically.

Low molecular weight cells, in which both p-type and n-type materials are vacuum deposited, have been known for many years (see for example Tang, C. W., App. Phys. Lett. 1986, 48, 183). These cells to date usually consist of copper phthalocyanine (CuPc) as a donor material and 3,4,9,10-perylene tetracarboxylic acid bisimide benzimidazole (PTCBI) or a fullerene (for example C60) as an acceptor material. The first Tang cell exhibited an efficiency of about 1%. Cells produced from the same organic materials have by now been improved and achieve an efficiency of 2.7% (Peumans et al., Nature of Materials, 2005, 4, 37-41).

The efficiencies of cells in which C60 is used as an acceptor material have so far increased to 5.0%. Two approaches are responsible for this:

In a first approach, instead of a smooth layer structure, a so-called "bulk heterojunction" raises the interface between n-type and p-type material. An increased proportion of excitons are therefore separated into a free hole and an electron, and can lead to a current.

In a second approach, an exciton blocking layer (EBL) is used between the acceptor layer and the cathode. This layer is intended to prevent the excitons from migrating to the cathode, where they would ineffectually decay at the junction between the metal and the organic layers. These blocking layers furthermore serve as a diffusion barrier against penetration of the electrode into the photoactive material.

If CuPc is replaced by SubPc (subphthalocyanine) in the Tang cell, then even higher photovoltages $V_{OC}$ can be achieved (up to about 0.97 V, cf. Mutolo, K., J. Am. Chem. Soc., 2006, 128, 8108). Other material combinations, such as oligiothiophenes (for example α, α'-bis(2,2-dicyanovinyl)-quinquethiophene, DCV5T) as a donor material with $C_{60}$ as an acceptor material, also exhibit high efficiencies (for example 3.4-3.8%, cf. Schulze et al., Adv. Mater., 2006, 18, 2872-2875; Schulze et al., Proc. of SPIE Vol. 6192, 61920C-1 (2006)). A more recent work uses so-called "triplet" absorbers, which exhibit a long exciton diffusion length (Yang, Y. Adv. Mater., 2005, 17, 2841).

An alternative approach to the use of vacuum methods for applying low molecular weight substances is to use soluble low molecular weight compounds which, similarly as polymers or oligomers, can likewise be applied wet-chemically. Cells produced in this way function according to the same principle as the low molecular weight cells described above. In this case p-type and n-type materials are processed from one or more solutions and/or dispersions. Many molecules of this type have already been used in such cells, but the efficiencies have to date been comparatively low. An improvement in the efficiency can be achieved by a heat treatment (anneal) of the junction (i.e. the bulk heterojunction), since this improves the arrangement of the molecules. This effect becomes particularly noticeable when the molecules being used are thermotropic liquid crystals (cf. Schmidt-Mende, L. et al., Science 2001, 293, 1119-1122).

Another concept consists in binding the donor material and the acceptor material covalently in a molecule. A cell type constructed in this way has, however, exhibited only comparatively low efficiencies to date (cf. Maggini, M., Chem. Commun., 2002, 2028-2029).

Polymer cells function according to the same principle as the low molecular weight cells described above. The difference is that at least one of the two absorbers (i.e. acceptor material and/or donor material) is a polymer and is therefore generally processed from solution. Examples of polymers which may be used are the derivatives of poly(p-phenylene-vinylene) (PPV), among which both donor materials and acceptor materials are encountered depending on the substituents. A typical example of a polymer acting as donor material is MEH-PPV (methylhexyl-substituted PPV), while cyano-substituted PPV (CN-PPV) can act as an acceptor material. Efficiencies of polymer cells constructed in this way have been in the region of 1%. The systems which have so far exhibited the best performances consist of P3HT (poly(3- hexylthiophene)) as donor material and PCBM ([6,6]-phenyl-$C_{61}$-butyric acid methyl ester) as acceptor material. Solar cells with efficiencies of up to between 4.8 and 5.0% are known. Low bandgap polymers are also used, and exhibit an improved absorption overlap with the solar spectrum. Efficiencies of about 3.2% can be achieved by using PCBM. Optical spacers have also sometimes been used in this case, in order to maximize the light absorption in the active layer. App. Phys. Lett, 2001, 78, 841 has shown that the effect on the efficiency depends on the processing (for example the solvent used etc.). New materials are used in order to improve the fraction of photons absorbed, for example low bandgap polymers e.g. PCPDTBT (poly[2,6-(4,4-bis-(2-ethylhexyl)-4H-cyclopenta[2,1-b;3,4-b]-dithiophene)-alt-4,7-(2,1,3-benzothiadiazole)] together with C71-PCBM, which exhibit an efficiency of up to 5.5%. Polymers are also used as donor materials, inter alia with perylenes or with inorganic nanorods as acceptor materials, with an efficiency of up to 1.7% in the latter case.

Organic solar cells which are processed from a solution have the advantage that they allow a multiplicity of economical production methods, which are suitable for a high throughput. Printing methods may for example be used for production, for example inkjet printing methods which also allow structuring of the organic layers.

Tandem Solar Cells

In order to utilize the energy of the photons better, so-called "tandem" concepts are available (cf. Meissner, D., Solarzellen [Solar Cells], pp. 129-136, Friedr. Vieweg & Sohn Verlagsgesellschaft mbH, 1993). Tandem cells comprising inorganic semiconductors are known, and they present high efficiencies under terrestrial light intensities. Known examples of such tandem solar cells are: GaInP/GaAs/Ge (32%±1.5), GaInP/GaAs (30.3%), GaAs/CIS (25.8%±1.3) and a-Si/μc-Si (11.7%±0.4) (Green, M. A., Prog. Photovolt; Res. Appl. 2006, 14, 455-461).

Tandem solar cells are advantageous in many cases, inter alia because the production costs of cells are generally surface area-dependent. The efficiency of the solar cells should therefore be as high as possible, which is achievable using tandem cells.

There are two- and four-contact tandem solar cells. In the case of four-contact tandem solar cells, the two subcells are connected together via an optical coupler (for example glass or a transparent sheet), each solar cell containing its own electrical terminals. The advantage of this is that both subcells can be optimized separately. A disadvantage with this type of tandem cell, however, is that additional reflections and absorptions may occur owing to the additional electrical terminals and the optical coupler.

In the case of two-contact tandem solar cells, the electrical contacting for the current take-off is carried out on the upper front contact of the upper subcell and on the lower contact of the lower subcell, i.e. the two subcells are directly coupled electrically. Fewer layers are required here, so that lower reflection and absorption losses occur. Furthermore, this concept is more economical owing to the smaller number of layers. In the two-contact tandem solar cell, however, the currents of the two subcells must be matched. Only then can the sum of the individual voltages of the two subcells be obtained in operation (i.e. with a closed circuit).

Initial tandem solder cells which are based on polymer materials are by now known, in particular polymer tandem cells with two contacts (Hadipour, A., Adv. Func. Mater., 2006, 16, 1897). These components exhibit an open circuit photovoltage ($V_{OC}$) of about 1.4 V. The measurement values disclosed for these components reveal that the upper solar cell delivers a smaller current than the lower solar cell. The total current of the tandem cell is limited by this discrepancy. Since the open circuit photovoltage of the tandem cell is the sum of the two cells, the efficiency is better than that of each individual cell. The cell was constructed as follows: glass substrate/Cr (1 nm)/Au (15 nm)/PEDOT:PSS (60 nm)/PFDTBT (poly((2,7-(9,9-dioctyl)-fluorene)-alt-5,5-(4',7'-di-2-thienyl-2',1',3'-benzothiadiazole) and PCBM (1:4)/LiF (0.5 nm)/Al (0.5 nm)/Au (15 nm)/PEDOT:PSS (60 nm) PTBEHT (poly{5,7-di-2-thienyl-2,3-bis(3,5-di(2-ethylhexyloxy)phenyl)-thieno[3,4-b]pyrazine}) and PCBM (1:4)/LiF (1 nm)/Al (100 nm).

A tandem structure can also be advantageous for low molecular weight cells. By using a two-contact tandem cell comprising two low molecular weight cells, the efficiency can be increased from about 5.0% to about 5.7%. (Forrest et al., Applied Physics Letters, 2004, 85, 5757-5759 and WO 02/101838). It is noteworthy that the photovoltage is more than 1 V with this structure. The cell was constructed as follows: glass substrate/indium tin oxide (ITO)/CuPc/CuPC:$C_{60}/C_{60}$/PTCBI/Ag/m-MTDATA (4,4',4"-tris((3-methylphenyl)-(phenyl)amino)triphenyl amine) (p-doped with 5 mol % of tetra-fluorotetracyanoquinodimethane/CuPc/CuPC:$C_{60}$/$C_{60}$/BCP (bathocuproine)/Ag (100 nm).

Similar cells have also been produced with CuPc and PTCBI (Triyana K., Jap. J. Appl. Phys., 2004, 43, 2352-2356). Here, Ag was compared with Au as a middle electrode (as a "floating" electrode, i.e. uncontacted electrode) and as a top electrode. The best efficiency was achieved with a tandem cell produced from the three subcells, and was about 2.37% with a $V_{OC}$ of between 1.35 V and 1.50 V. The cell structure was as follows: glass/ITO/PEDOT:PSS/organic/Ag/organic/Ag/organic/Ag, where the expression "organic" stands for CuPc/PTCBI here.

Tandem cells with methyl-perylene tetracarboxylic acid diimide (Me-PTC) and metal-free phthalocyanine ($H_2Pc$) are furthermore known (Hiramoto, M., Chem. Lett. 1990, 327, 1990). In these cells, however, the efficiency was still comparatively low. Tandem solar cells in which organic subcells are vapor deposited on polymer subcells are also known.

Four-contact tandem dye solar cells have also been produced, and exhibited an efficiency of 10.5% (see Dürr, M. et al., App. Phys. Lett., 2004, 84, 3397). In this case a polymer-gel electrolyte with $I^-/I_3^-$ was used, in combination with cis-bis(isothiocyanato)bis(2,2'-bipyridyl-4,4'-dicarboxylic acid) ruthenium(II) as a red dye in the front subcell and tri(isothiocyanato)(2,2':6',2"-terpyridyl-4,4',4"-tricarboxylic acid) R(II) as a black dye in the rear subcell. Since the subcells are not electrically coupled, the short circuit photocurrents were added.

An n-p tandem dye solar cell was first described by Hagfeldt et al. 2000 (He, J., Hag-feldt, A., et al., Solar Energy Materials & Solar Cells, 2000, 62, 265). In this case an electrolyte of LiI (0.5 M), $I_2$ (0.05 M) in ethylene carbonate/propylene carbonate was introduced between sensitized photoanodes ($TiO_2$, cis-bis(isothiocyanato)bis(2,2'-bipyridyl-4,4'-dicarboxylic acid) ruthenium(II)) and sensitized photocathodes (NiO, erythrosine B). Although a higher photovoltage (732 mV) was observed, the efficiency nevertheless remained rather low (0.39%).

A similar work used NiO/3-carboxymethyl-5-[2-(3-octadecyl-2-benzothiazolinylidene)ethylidene]-2-thioxo-4-thiazolidine as a photocathode (Nakasa, A., Chem Lett., 2005, 34, 500; JP 2006147280). In this case the efficiency rose to 0.78% and the maximum observed photovoltage rose to 0.918 V. These cells therefore also still present comparatively low efficiencies and photovoltages.

Overall, these tandem cell concepts, which are based on a doubly sensitized dye cell with a sensitized photoanode and a sensitized photocathode, are nevertheless complex in structure and leave considerable room for improvements in respect of the efficiencies achieved. The use of liquid electrolytes can also be seen to be highly detrimental. Furthermore, the voltages achieved to date (open circuit voltage, $V_{OC}$) are still comparatively low (typically less than 1 V), and photocathodes sensitized in a sufficiently efficient way are still not yet known.

It is therefore an object of the present invention to provide a photovoltaic element which avoids the disadvantages of the above-described elements known from the prior art. The photovoltaic element should in particular have a high quantum efficiency and be simple to produce.

This object is achieved by a photovoltaic element having the features of independent claim 1. Advantageous refinements, which may be implemented separately or in combination, are presented in the dependent claims. The wording of all the claims is hereby incorporated into the content of this description.

A photovoltaic element for converting electromagnetic radiation into electrical energy is provided, which has a tandem cell structure. The tandem cell structure comprises the following:
  a dye solar cell having a first electrode, an n-type semiconducting metal oxide, a dye absorbing electromagnetic radiation in a first spectral range and a solid p-type semiconductor; and
  an organic solar cell having an acceptor material and a donor material, the acceptor material and/or the donor material comprising an organic material, the organic solar cell furthermore comprising a second electrode on an opposite side from the dye solar cell, and the organic solar cell being configured to absorb electromagnetic radiation in a second spectral range, which is at least partially different to the first spectral range,
  the first electrode and/or the second electrode being at least partially transparent for the electromagnetic radiation.

The term "transparent electrode" in this context is intended to mean in particular that there is a transmission of at least 50%, preferably at least 80%, within the visible spectral range and/or in the range of the solar spectrum (about 300 nm to 2000 nm).

The present invention thus relates to the combination of the two main types of organic solar cells, namely dye solar cells with dye-sensitized metal oxides and the organic solar cells which comprise organic monomers, oligomers or polymers (and optionally also inorganic nanoparticles or other additives), at least the acceptor material (n-type semiconductor) or the donor material (p-type semiconductor) comprising an organic material. Further cells may also be present besides this basic structure, for example a structure in which, in addition to the combination of dye solar cell and organic solar cell mentioned, at least one further cell is present, i.e., for example, a triple-cell structure. However, in the context of the present invention, in general a structure with two cells stacked above one another is preferred, i.e. a structure in which the components described above (dye solar cell and organic solar cell) are placed or arranged above one another as layers.

Preferably all the materials used are solid materials. Furthermore the dye solar cell is preferably used as the front subcell, i.e. the one facing the exposure side, and the organic solar cell as the rear subcell. The acceptor material in the organic solar cell is also preferably arranged on the side of the subcell facing the dye solar cell, and the donor material on the side facing away from the dye solar cell. As seen from the dye solar cell, this preferably leads to an n-p junction instead of a p-n junction inside the organic solar cell (expressed in semiconductor terminology). Other structures are however also possible.

In principle, the tandem cell structure may furthermore be produced as a four-contact structure. Owing to more favorable production, however, a two-contact structure preferably with only two electrodes is preferred. The electrode which is in contact with the dye solar cell (working electrode of the dye solar cell) is in this case preferably transparent. The first (transparent) electrode may preferably be applied onto an at least partially transparent support (for example a glass substrate and/or a plastic substrate, which is rigid or transparent). This may be followed by the dye solar cell, then the organic solar cell on which there is in turn the (not necessarily transparent) second electrode as a cover electrode or top electrode. The light to be converted into electrical energy then enters through the transparent support first into the dye solar cell, where it is partially absorbed (in particular by the dye), then it enters the organic solar cell where (preferably in an at least partially different spectral range) it is again absorbed at least partially (by at least one of the organic materials, i.e. the acceptor material and/or the donor material and/or a separate absorber, for example a doped-in absorber). Other layer structures are however also conceivable, for example inverted structures.

The proposed structure has a range of advantages over known photovoltaic elements. In particular, longwave light can be utilized better by the organic solar cell if an appropriate selection of donor and acceptor materials is made. In particular, the donor and/or acceptor material may be selected so that it absorbs in the near infrared range (NIR). This can lead to better utilization of the solar spectrum and therefore to a better efficiency. In particular, the two subcells may be selected so that they absorb complementarily, so that very high efficiencies can be achieved. It is particularly preferable for the dye of the dye solar cell to exhibit absorption in the range of between 400 nm and 700 nm, while it is preferable for the acceptor material and/or the donor material of the organic cell to be selected so that they exhibit absorption in the range of between 600 nm and 1000 nm. This choice is preferred in particular since dye solar cells generally need to be made very thin (typically 1-2.5 micrometers) so that not all of the incident light can always be used fully. It is precisely this longwave component of the spectrum, which is used only to a small extent, that can be used efficiently by the tandem cell structure with said selection of the absorption of the organic solar cell, which can significantly increase the overall efficiency of the structure.

Another advantage of the proposed structure, particularly when using a "solid electrolyte" with a p-type semiconductor instead of an electrolyte in liquid or gel form, is that the current components of the two subcells can be matched to one another comparatively simply. As described above, a disadvantage of known two-contact tandem cells is that the subcell with the smaller current limits the total current. With the proposed structure, however (for example by adjusting the material parameters, selecting suitable absorbers and/or adjusting the layer thicknesses), the currents of the two subcells can be adjusted comparatively easily. An efficient element can thereby be produced, in which the photovoltages of the two subcells add to give a high total voltage. Furthermore, the proposed cell structure also avoids the aforementioned disadvantages of the tandem cell concepts of He, Hagfeldt et al. and von Nakasa et al. that are known from the prior art, which are doubly sensitized with dye and use a liquid electrolyte, and it allows a considerably simplified cell structure which, for example, may be produced by production technology in a single continuous line. In particular, it is possible to avoid the structure described by Hagfeldt et al. which requires double dye sensitization (sensitized oxide anode and sensitized oxide cathode).

The basic structure proposed above may advantageously be configured or developed in various ways. Some of these developments are presented in the dependent claims, and some of the preferred options will be described below. For further possible details, reference may be made to the following examples and to the materials and techniques presented in the prior art as described in the introduction.

1. The Dye Solar Cell

First Electrode and N-Type Semiconducting Metal Oxide

A single metal oxide or a mixture of different oxides may be used as the n-type semi-conducting metal oxide of the dye solar cell. It is also possible to use mixed oxides. The n-type semiconducting metal oxide may in particular be used as a nanoparticulate oxide, nanoparticles in this context being intended to mean particles which have an average particle size of less than 0.1 micrometers.

A nanoparticulate oxide is conventionally applied by a sintering process as a thin porous film with a large surface area onto a conducting substrate (i.e. a support having a conducting layer as the first electrode).

Besides metal foils, above all plastic plates or sheets and particularly glass plates are suitable as the substrate (also referred to below as the support). In particular conducting materials, for example transparent conducting oxides (TCO), for example tin oxide doped with fluorine and/or indium (FTO and ITO, respectively) and/or aluminum-doped zinc oxide (AZO), carbon nanotubes or metal films are suitable as the electrode material, in particular for the first electrode according to the preferred structure described above. As an alternative or in addition, however, thin metal films which still have sufficient transparency could also be used. The substrate may be covered or coated with these conducting materials.

Since only a single substrate is generally required for the proposed structure, it is also possible to construct flexible cells. This allows a multiplicity of application tasks which cannot be carried out with rigid substrates, or can be carried out only with difficulty, for example use in bank cards, articles of clothing etc.

The first electrode, in particular the TCO layer, may additionally be covered or coated with a (for example 10 to 200 nm thick) solid buffer layer, in particular a metal oxide buffer layer, in order to avoid direct contact of the p-type semiconductor with the TCO layer (see Peng et al., Coord. Chem. Rev. 248, 1479 (2004)). The buffer metal oxide which can be used in the buffer layer may, for example, comprise one or more of the following materials: vanadium oxide; a zinc oxide; a tin oxide; a titanium oxide. The inventive use of solid p-type semiconducting electrolytes, however, for which contact of the electrolyte with the first electrode is greatly reduced in comparison with electrolytes in liquid or gel form, makes this buffer layer unnecessary in many cases so that this layer, which has a current-limiting effect and can also degrade the contact of the n-type semiconducting metal oxide with the first electrode, may be obviated in many cases. This increases the efficiency of the components. On the other hand, such a buffer layer may in turn be used expediently in order to match the current component of the dye solar cell to the current component of the organic solar cell. For cells in which the buffer layer has been obviated, particularly in solid cells, problems with undesirable recombinations of charge carriers furthermore often occur. To this extent, specifically in solid cells, buffer layers are advantageous in many cases.

Thin layers or films of metal oxides are known to generally represent economical solid semiconductor materials (n-type semiconductors), although owing to large bandgaps their absorption usually lies not in the visible range of the electromagnetic spectrum, but mostly in the ultraviolet spectral range. For application in solar cells, the metal oxides must generally, as is the case with dye solar cells, be combined with a dye as a photosensitizer which absorbs in the wavelength range of sunlight, i.e. 300 to 2000 nm, and which in the electronically excited state injects electrons into the conduction band of the semiconductor. With the aid of a solid p-type semiconductor additionally used in the cell as an electrolyte, which is in turn reduced at the back electrode (or at the junction with the second subcell in a tandem solar cell), electrons can be fed back to the sensitizer so that it is regenerated.

The semiconductors zinc oxide, tin oxide, titanium dioxide or mixtures of these metal oxides are of particular interest for application in solar cells. The metal oxides may be employed in the form of nanocrystalline porous layers. These layers have a large surface area which is coated with the sensitizer, so that high absorption of sunlight is achieved. Metal oxide layers which are structured, for example nanorods, offer advantages such as higher electron mobilities or improved pore filling by the dye.

The metal oxide semiconductors may be used separately or in the form of mixtures. It is also possible to coat a metal oxide with one or more metal oxides. The metal oxides may furthermore be applied as a coating on another semiconductor, for example GaP, ZnP or ZnS.

Zinc oxide and titanium dioxide in the anatase modification, which is preferably used in nanocrystalline form, are particularly preferred semiconductors.

The sensitizers may furthermore advantageously be combined with all n-type semiconductors which are conventionally employed in these solar cells. Metal oxides used in ceramics may be mentioned as preferred examples, such as titanium dioxide, zinc oxide, tin(IV) oxide, tungsten(VI) oxide, tantalum(V) oxide, niobium(V) oxide, cesium oxide, strontium titanate, zinc stannate, complex oxides of the perovskite type, for example barium titanate, and binary and ternary iron oxides, which may also be present in nanocrystalline or amorphous form.

Owing to the strong absorption which is exhibited by conventional organic dyes, as well as phthalocyanines and porphyrins, even thin layers or films of the n-type semiconducting metal oxide are sufficient in order to receive the required amount of dye. Thin metal oxide films in turn have the advantage that the likelihood of undesirable recombination processes is lowered and that the internal resistance of the dye solar cell is reduced. Layer thicknesses of from 100 nm up to 20 micrometers, particularly preferably in the range of from 500 nm to about 3 micrometers, may preferably be used for the n-type semiconducting metal oxide.

Dye

Many dyes which can be used in the scope of the present invention are known from the prior art, so that reference may also be made to the above description of the prior art regarding dye solar cells for possible material examples. All dyes mentioned and claimed may in principle also be present as pigments. Dye-sensitized solar cells, which are based on titanium dioxide as the semiconductor material, are described for example in U.S. Pat. No. 4,927,721, Nature 353, pp. 737-740 (1991) and U.S. Pat. No. 5,350,644 as well as Nature 395, pp. 583-585 (1998) and EP-A-1 176 646. The dyes described in these documents may in principle also be used advantageously in the scope of the present invention. These dye solar cells contain monomolecular films of transition metal complexes, in particular ruthenium complexes, which are bound via acid groups to the titanium dioxide layer as sensitizers.

Not least for cost reasons, metal-free organic dyes are also repeatedly proposed as sensitizers, and these may also be employed in the scope of the present invention. High efficiencies of more than 4%, particularly in solid dye solar cells, can be achieved for example with indoline dyes (see for example Schmidt-Mende et al., Adv. Mater. 2005, 17, 813). U.S. Pat. No. 6,359,211 describes the use, which may also be employed in the scope of the present invention, of cyanine, oxazine, thiazine and acridine dyes that comprise carboxyl groups bound via an alkylene radical for fixing to the titanium dioxide semiconductor.

JP-A-10-189065, 2000-243463, 2001-093589, 2000-100484 and 10-334954 describe various perylene-3,4:9,10-tetracarboxylic acid derivatives, unsubstituted in the perylene main chain, for use in semiconductor solar cells. Specifically, these are: perylene tetra-carboxylic acid diimides which carry carboxyalkyl, carboxyaryl, carboxyarylalkyl or carboxyalkylaryl radicals on the imide nitrogen atoms and/or are imidized with p-diaminobenzole derivatives, in which the nitrogen atom of the amino group in the p-position is substituted by two further phenyl radicals or is part of a heteroaromatic tricyclic system; perylene-3,4:9,10-tetracarboxylic acid monoanhydride monoimides which carry the aforementioned radicals or not further functionalized alkyl or aryl radicals on the imide nitrogen atom, or semicondensates of perylene-3, 4,9,10-tetracarboxylic acid dianhydride with 1,2-diaminobenzoles or 1,8-diaminonaphthalenes, which are converted by further reaction with primary amine into the corresponding diimides or double condensates; condensates of perylene-3,4,9,10-tetracarboxylic acid dianhydride with 1,2-diaminobenzoles which are functionalized by carboxyl or amino radicals; and perylene-3,4:9,10-tetracarboxylic acid diimides which are imidized with aliphatic or aromatic diamines.

New J. Chem. 26, pp. 1155-1160 (2002) studies the sensitization of titanium dioxide with perylene derivatives, which are not substituted in the perylene main chain (bay positions). Specifically mentioned are 9-dialkylaminoperylene-3,4-dicarboxylic acid anhydrides, perylene-3,4-dicarboxylic acid imides which are substituted in the 9-position by dialkylamino or carboxymethylamino and carry a carboxymethyl or 2,5-di(tert.-butypphenyl radical on the imide nitrogen atom, and n-dodecylaminoperylene-3,4:9,10-tetracarboxylic acid monoanhydride monoimide. The liquid electrolyte cells based on these perylene derivatives, however, exhibit substantially lower efficiencies than a solar cell sensitized for comparison with a ruthenium complex.

Particularly preferred as sensitizer dyes in the proposed dye solar cells are the perylene derivatives, terylene derivatives and quaterrylene derivatives described in DE 10 2005 053 995 A1 or WO 2007/054470 A1. The use of these dyes leads to photovoltaic elements with high efficiencies and at the same time high stabilities.

The rylenes exhibit absorption in the wavelength range of sunlight, and may in this case cover a range of from about 400 nm (perylene derivatives I in DE 10 2005 053 995 A1) to about 900 nm (quaterrylene derivatives I in DE 10 2005 053 995 A1), depending on the length of the conjugated system. Depending on their composition, rylene derivatives I based on terylene in the solid state adsorbed on titanium dioxide absorb in a range of from about 400 to 800 nm. In order to achieve maximally extensive use of the incident sunlight from the visible into the infrared range, it is advantageous to use mixtures of different rylene derivatives I. It may sometimes also be recommendable to use different rylene homologs in this case.

The rylene derivatives I may be readily and permanently fixed on the metal oxide film. The binding in this case takes place via the anhydride function (x1) or the in-situ formed carboxyl groups —COOH or —COO— or via the acid groups A contained in the imide or condensate radicals ((x2) or (x3)). The rylene derivatives I described in DE 10 2005 053 995 A1 are highly suitable for use in dye-sensitized solar cells in the scope of the present invention.

It is particularly preferable for the dyes to comprise an anchor group at one molecule end, which fixes them to the n-type semiconductor film. At the other molecule end, the dyes preferably contain electron donors Y which facilitate regeneration of the dye after the electron delivery to the n-type semiconductor and furthermore prevent recombination of the electrons already delivered to the semiconductor.

For further details regarding the possible selection of a suitable dye, reference may for example again be made to DE 10 2005 053 995 A1. In particular ruthenium complexes, porphyrins, other organic sensitizers and preferably rylenes may be used for the tandem cells described here.

The fixing of the dyes on the metal oxide films may be carried out in a straightforward way. For example, the n-type semiconducting metal oxide films in the freshly sintered (still warm) state may be brought in contact for a sufficient period of time (for example from 0.5 to 24 h) with a solution or suspension of the dye in a suitable organic solvent.

This may, for example, be done by immersing the substrate coated with a metal oxide into the solution of the dye.

If combinations of different dyes are intended to be used, then these may for example be applied successively from one or more solutions or suspensions which contain one or more of the dyes. It is also possible to use two dyes which are separated by a layer of, for example, CuSCN (see in this regard for example Tennakone, K. J., Phys. Chem. B. 2003, 107, 13758). The most expedient method may be determined comparatively easily in the individual case.

Concerning the selection of the dye and the size of the oxide particles, the solar cells should be configured so that as much light as possible is absorbed by the two subcells. For this reason, as already described above, the dyes should as far as possible be selected complementarily. The oxide layers should in this case be structured so that the solid p-type semiconductor can fill the pores well.

In principle, the dye may be present as a separate element or may be applied in a separate step and applied separately to the remaining layers. Alternatively or additionally, the dye may, however, also be combined or applied together with one or more of the other elements, for example with the solid p-type semiconductor. For example, it is possible to use a dye-p-type semiconductor combination which comprises an absorbent dye with p-type semiconducting properties or, for example, a pigment with absorbing and p-type semiconducting properties.

As described above, the proposed tandem cell concept comprises the use of one or more solid p-type semiconductors. Further materials with similar properties may naturally also be present in addition to the solid p-type semiconductor or semiconductors, for example solid electrolytes, although exclusive use of the at least one p-type semiconductor is preferred. In order to prevent recombination of the electrons in the n-type semiconducting metal oxide with the solid p-type semiconductor, a kind of passivating layer which comprises a passivation material may be used. This layer should be as thin as possible, and should as far as possible cover only the previously uncovered positions of the n-type semiconducting metal oxide. Under certain circumstances, the passivation layer may also be applied onto the metal oxide chronologically before the dye. The following substances in particular are preferred as passivation materials: $Al_2O_3$; an aluminum salt; silanes, for example $CH_3SiCl_3$; an organometallic complex, in particular an $Al^{3+}$ complex; $Al^{3+}$, in particular an $Al^{3+}$ complex; 4-tert-butylpyridine (TBP); MgO; 4-guanidinobutyl acid (GBA); an alkyl acid; hexadecylmalonic acid (HDMA).

p-Type Semiconductor

As described above, solid p-type semiconductors are used in the scope of the tandem concept proposed here. Solid p-type semiconductors may be employed in the dye-sensitized subcells according to the invention even without a great increase in the cell resistance, in particular when the dyes absorb strongly and therefore require only thin n-type semiconductor layers. In particular, the p-type semiconductor should essentially comprise a continuous, dense layer so as to avoid undesirable recombination reactions which could result from contact between the n-type semiconducting metal oxide (particularly in nanoporous form) with the second electrode or the second subcell.

An essential quantity which influences the selection of the p-type semiconductor is the hole mobility, since this jointly determines the hole diffusion length (cf. Kumara, G., Langmuir, 2002, 18, 10493-10495). A comparison of charge carrier mobilities in various Spiro compounds may be found, for example, in Saragi, T., Adv. Funct. Mater. 2006, 16, 966-974.

Examples of solid p-type semiconductors are inorganic solids, such as copper(I) iodide and copper(I)thiocyanate. It is however preferable to use organic semiconductors (i.e. low molecular weight, oligomeric or polymeric semiconductors or mixtures of such semiconductors). Examples are in this case p-type semiconductors based on polymers such as polythiophene and polyaryl amines, or on amorphous, reversibly oxidizable nonpolymeric organic compounds such as the spirobifluorenes mentioned in the introduction (cf. for example US 2006/0049397 and the Spiro compounds disclosed therein as p-type semiconductors, which may also be used in the scope of the present invention). These solid p-type semiconductors may be used both in the undoped and doped form.

Furthermore, reference may also be made to the comments regarding p-type semiconducting materials in the description of the prior art. Substantial reference may also be made to the above description for the other possible elements and the possible structure of the dye solar cell.

2. Optional Charge Recombination Zone Between Dye Solar Cell and Organic Solar Cell Since the photovoltaic element proposed here is an element according to the tandem concept, it should be ensured that electrons from the n-type semiconductor of the organic solar cell recombine with the holes from the p-type semiconductor of the dye solar cell with a minimum energy loss. Otherwise, the charge carriers either cannot recombine with one another, which leads to a greatly suppressed photo current, or the voltage losses become very great.

In a preferred configuration of the invention, a charge recombination zone is therefore used between the two subcells in order to capture the holes of the dye solar cell and electrons of the organic solar cell. A similar concept is described in WO 02/101838. The charge recombination zone should be at least partially transparent, at least in the spectral range which is predominantly absorbed by the second subcell downstream in the incidence direction, so that the second subcell (for example the organic solar cell) is also exposed sufficiently. This charge recombination zone should therefore preferably be as thin as possible, preferably thinner than 20 Å (2.0 nm), preferably about 5 Å (0.5 nm) thick. It is not in this case categorically necessary for a homogeneous layer to be formed, rather the charge recombination zone may for example also be an island growth, for example in the form of isolated metal nanoparticles. The use of metal nanoparticles in the charge recombination zone may also have the positive effect of a resonance elevation and therefore increased absorption by the adjacent active material (see for example Rand, B., J. Appl. Phys. 2004, 96, 7519). Metals may preferably be used as materials for the charge recombination zone, for example Ag, Au, Li, Al, Ti, Sn or combinations and alloys of these and/or other metals, as well as metal oxides (which may also be doped) and/or metal fluorides, for example LiF, optionally in combination with a metal, for example Al. As an alternative or in addition, conducting polymers could also be used, for example PEDOT (poly(3,4-ethylene dioxythiophene) poly(styrene sulfonate)). Of the metal oxides, $WO_3$ in particular is preferred. Among metals the use of silver and/or gold is preferred, the use of silver being particularly preferred. Combinations of different metals and/or metal halides may also be used.

As an alternative or in addition to the deliberate introduction of recombination materials, for example the materials described above, other concepts may also be used to generate a charge recombination zone. Electronically active defects, which lead to electron-hole recombination in the charge recombination zone, may for example be used. To this end, for example, in the region of the charge recombination zone defects may deliberately be introduced in a restricted way into the layer structure or the interface between the dye solar cell and the organic solar cell. These defects, which act as electronically active defects, may result from controlled introduction of impurities, exposure to high-energy particle radiation during the deposition of the respective organic layers or from other techniques. Microwave irradiation, a plasma treatment or a treatment with particles excited by microwaves are also possible. Such methods for deliberately introducing defects by corresponding treatment are known and may be adopted, for example, from the technique of inorganic semiconductor fabrication. Alternatively or additionally, the charge recombination zone may also comprise a highly doped p/n junction, i.e. may comprise a zone in which the materials used are more highly doped than in the remaining layers.

3. The Organic Solar Cell

As described above, the organic solar cell preferably follows the dye solar cell directly or via the charge recombination zone. Preferably, as likewise described above, first the dye solar cell is deposited on the support and then the organic solar cell is applied. The organic solar cell will in this case be deposited (directly or after application/introduction of the charge recombination zone) on the already existing dye solar cell.

With the organic solar cell, the inventive tandem cell structure is revealed to be particularly advantageous since organic solar cells are usually made very thin owing to the requirements for charge and/or exciton transport inside the layers. With a decreasing thickness, however, the efficiency of the light absorption is also reduced. This detrimental effect can in turn be mitigated by the tandem cell concept.

The organic solar cell comprises at least one acceptor material (n-type semiconductor) and at least one donor material (p-type semiconductor), which are directly or indirectly in contact with one another at a p-n junction, although there may also be interlayers (similarly as a p-i-n junction). Instead of the layers and multilayer structures described above and below, as an alternative or in addition, mixed layers of said materials may generally also be used fully or partially i.e. for example a single mixed material layer instead of a two-layer structure having two separate materials (for example an acceptor material layer and a donor material layer). Transition layers between two separate layers are also possible, for example with an acceptor material layer, an interlayer having a mixture of an acceptor material and a donor material (this also theoretically involves a bulk heterojunction, see below) and subsequently a donor material layer. So-called "bulk heterojunctions" may furthermore be used, i.e. structures known from the field of solar cell technology in which there is a boundary layer with a greatly enlarged surface area between two layers, for example an acceptor material layer and a donor material layer. The individual layers in this case engage in one another with a multiplicity of "ridges" and "troughs" along the very uneven interface. This bulk heterojunction may advantageously be used in particular for the acceptor-donor material structure of the organic solar cell.

Thus, the organic solar cell may preferably comprise a transition between a layer of the acceptor material and a layer of the donor material, the layer of acceptor material being arranged on a side facing the dye solar cell and the layer of donor material being arranged on a side of the transition facing away from the dye solar cell (n/p junction). This transition may be configured as a direct transition between an n-type layer and a p-type layer, although it may additionally comprise a mixed layer of at least one acceptor material and at least one donor material between the layer of acceptor material and the layer of donor material (i.e. a bulk heterojunction). The transition and the layers of this transition may for example be generated fully or partially in the form of polymer layers (for example produced from a solution or dispersion) and/or in the form of pigments (preferably vapor deposited and/or produced from a dispersion) or dyes (preferably produced from a solution or a dispersion), i.e. low molecular weight organic materials.

At least one of the two materials (acceptor material and/or donor material) should at least partially absorb electromagnetic radiation, i.e. particularly light. This absorption should in particular be selected so that it is "complementary" with the absorption by the dye solar cell, i.e. at least not congruent. For example, it is preferable for the dye solar cell to exhibit its predominant absorption (for example an absorption maximum) in a shorter (i.e. more energetic) wavelength range than the organic solar cell. For instance, as described above, it is preferable for the organic solar cell to absorb in a range which lies between 600 nm and 1000 nm (although this wavelength range naturally need not be covered fully, and naturally there may also be absorptions in other ranges) while the dye solar cell preferably absorbs in a range which lies between 400 nm and 700 nm (here again, there may naturally be incomplete coverage of this range and/or also absorption in another range). However, a reverse configuration is also possible in principle, i.e. a configuration in which the dye solar cell has its predominant absorption in a longer wavelength range than the organic solar cell.

When applying the organic solar cell, it is preferable to apply first the acceptor material (n-type material), i.e., for example, in the structure described above the material lying closest to the dye solar cell. In order to couple the organic solar cell to the charge recombination zone in an electronically efficient manner, at least one electron transport layer (ETL) may be introduced between the latter and the acceptor material of the organic solar cell. An electron transport layer is understood generally to mean a layer of one or more materials which have electron-conducting or electron-transporting properties. As required, this ETL may also be n-doped. The donor material (p-type material) of the organic solar cell is then applied to the acceptor material, a mixed layer of n-type and p-type materials often being formed or deliberately induced at the junction.

The electron transport layer, for which a plurality of electron transport layers may also be provided in a corresponding manner, may comprise in particular one or more of the following materials: a triphenylene derivative; 1,3-bis(4-tert-butylphenyl-1,3,4-oxadiazoyl)phenylene (OXD7); 1,3-bis(4-(N,N-dimethylamino)phenyl-1,3,4-oxadiazoyl)phenylene (OXD8); 2-(1-naphthyl)-5-(p-tert-butylphenyl)-1,3,4-oxadiazole (t-Bu-PNF); a titanium oxide (TiOx); bathophenanthroline (BPhen); 2,9-dimethyl-4,7-diphenyl-1,10-phenanthroline (BCP); 3-(biphenyl-4-yl)-4-phenyl-5-(4-tert-butylphenyl)-1,2,4-triazole (TAZ); a ruthenium complex.

In particular when using soluble materials, it is possible, as an alternative to sequential deposition of the acceptor and donor materials, to deposit these materials fully or partially simultaneously and then for example to anneal them. For example, pigments may be vapor deposited and/or applied from a dispersion and dyes or polymers applied from a solution. Two vapor deposited materials or two soluble materials may be used, for example, although it is also conceivable to use combinations of soluble and vapor deposited materials.

In principle the organic semiconductors which are described in the prior art, and which are partially presented in the introduction, may be used in the organic solar cell. Some preferred examples will be listed below.

When adjusting the layer thicknesses of the n-type semiconductor and the p-type semiconductor and the junction, it is necessary to ensure on the one hand that a great deal of light is absorbed while at the same time most excitons reach the p-n junction, without previously decaying. Here, the requirements and principles known from molecular solar cells generally apply.

Acceptor Material

Acceptor materials are materials in which the principal charge carriers are electrons. They preferably have a high conductivity for electrons in the LUMO (LUMO: lowest unoccupied molecular orbital), high stability in respect of negative excess charging (reduction), LUMO levels or electron affinities in the suitable energy range and good properties of electron injection into a suitable cathodic electrode. For further properties of suitable n-type materials or acceptor materials, reference may be made for example to WO 02/101838 A1.

Depending on the substitution pattern and solubility, a plurality of exemplary materials may be applied either from the solution and/or dispersion or from a vacuum. Rhodamines and triphenyl methanes are particularly to be mentioned here. All materials mentioned here and below may be fully or partially present as dyes and/or pigments, dyes generally being applied from a solution while pigments are in many cases applied in a vacuum.

Furthermore, fullerenes may also be used as an alternative or in addition. These may be selected from a multiplicity of sizes (number of carbon atoms per molecule). The term "fullerenes" as used here comprises various cage-like molecules of pure carbon, including Buckminster fullerene ($C_{60}$) and the related "spherical" fullerenes, as well as carbon nanotubes. The fullerenes in the range of from $C_{20}$ to $C_{2000}$ may in principle be used, the range $C_{60}$-$C_{96}$ being preferred, particularly $C_{60}$ and $C_{70}$. Fullerenes which are chemically modified may also be used, for example PCBM ([6,6]-phenyl-$C_{61}$-butyric acid methyl ester), bis-morpholine-$C_{60}$ (BM-$C_{60}$), $C_{71}$-PCBM, $C_{60}$-P N-methylfullerene pyrrolidine or mixtures of these fullerenes (for example $C_{60}$) are distinguished in particular by a long exciton diffusion length (for example about 80 Å for $C_{60}$, cf. Petterson et al., J. Appl. Phys., 1999, 86, 487.)

Inorganic nanorods and/or quantum dot materials may furthermore be used, for example cadmium selenide (CdSe), cadmium telluride (CdTe), CdS, HgTe, PbS, $CuInS_2$ or similar materials or material combinations.

Other inorganic semiconductor materials may furthermore be used, preferably in combination with an organic material. It is in particular possible to use zinc oxide, tin oxide and $TiO_2$, which are preferably used as partner materials for organic materials. These may be present in nanoparticulate form and/or as nanorods.

Carbon nanotubes (NT) may furthermore be used as or in the acceptor materials. Either single wall carbon nanotubes (SWNTs) or multiwall carbon nanotubes (MWNTs) may be used in this case.

n-type semiconducting polymers may also be used, and (as an alternative or in addition) LBG polymers i.e. "low bandgap polymers", that is to say polymers with a small bandgap, for example CN-PPV.

However, it is particularly preferred to use rylene dyes and rylene tetracarboxylic acid dyes or rylene monoimides, for example naphthalene, perylene, terrylene, quaterrylene, pentarylene, hexarylene, heptarylene and octarylene, or pigments, for example naphthalene, perylene, terrylene, quaterrylene, pentarylene, hexarylene, heptarylene and octarylene or mixtures, compounds or derivatives of these materials. Furthermore, perylene tetracarboxylic acid bisimidazole (PTCBI) and pyrimidines may also be used. Liquid crystalline derivatives may furthermore be used, for example corresponding derivatives of perylene, terrylene or quaterrylene, for example the compounds described in Mullen et al. Chem. Mater. 2006, 18, 3715-3725. Also particularly preferred, as an alternative or in addition, is the use of the substituted rylene derivatives described in WO 2007/006717 A1, the terrylene and/or quaterrylene derivatives described in WO 2006/117383 A1 and/or the pentarylene and/or hexarylene derivatives described WO 2006/111511 A1.

In particular, the following pigments may be used: 3,4,9,10-perylene tetracarboxylic acid bisimide benzimidazole (PTCBI), perylene tetracarboxylic acid bisimide bisanhydride (PTCBA), Me-PTCDI, ethyl phenyl-PTCBI, or combinations of these and/or other materials. Tetrabromine- and tetrachlorine-substituted perylene tetracarboxylic acid diimides are also suitable acceptor materials or n-type semiconductors.

Donor Materials

Donor materials (p-type semiconductors) are materials in which the principal charge carriers are holes or defect electrons (or their organic conduction pendants). These materials preferably have a high conductivity of holes in the HOMO (HOMO: highest occupied molecular orbital), high stability in respect of positive excess charging (oxidation), HOMO levels or ionization potentials in the suitable energy range and good properties of hole injection into a suitable anodic electrode. For further properties of suitable p-type materials or donor materials, reference may be made for example to WO 02/101838 A1.

Pentacenes may in particular be used as donor materials, and also phthalocyanine (Pc) pigments. The phthalocyanines may in this case be substituted or unsubstituted. Symmetrically substituted, i.e. unsubstituted, 8-fold substituted or 16-fold substituted phthalocyanines are particularly preferred, although 4-fold substituted Pcs could also be suitable under certain circumstances. The phthalocyanines may contain metal or be metal-free. CuPc, ZnPc, 4F—ZnPc, SnPc, vanadyl phthalocyanine (VOPc), $H_2Pc$, TiOPc or mixtures or derivatives of these Pcs are particularly preferred. Subphthalocyanines, such as those described for example in Forrest, Thompson, JACS 2006, 128, 8108-8109, may also be used under certain circumstances.

Besides the (at least essentially insoluble in solvents) phthalocyanine pigments, as an alternative or in addition it is also possible to use phthalocyanine dyes which can be processed from a solution. Liquid crystal ethynyl substituted Ni(II)Pc may be mentioned as an example here, as described for example in Chem. Commun., 2006, 3107 or in WO 2005/076383. LC-Pc dyes may also be used.

Porphyrins may furthermore be used, for example 5,10,15,20-tetra(3-pyridyl)porphyrin (TpyP), as well as merocyanines.

Liquid crystal materials may also be used, for example hexabenzocoronenes (HBC-PhC12) or other coronenes, coronene diimides, or triphenylenes such as 2,3,6,7,10,11-hexahexyl thiotriphenylene (HTT6) or 2,3,6,7,10,11-hexa-(4-n-nonylphenyl)-triphenylene (PTP9), 2,3,6,7,10,11-hexa-(undecyloxy)-triphenylene (NAT11). In particular, liquid crystal materials which are discotic may be used. 2,3,9,10,16,17,23,24-octa(2-benzyloxyethylsulfanyl)phthalocyanato copper(II) (DL-CuPc) or other Pcs with alkyl, alkoxy or thioalkoxy chains, which are discotic liquid crystal materials, may also be used.

Thiophenes may furthermore be used, as well as thiophene-containing compounds and thiophene derivatives. In particular thiophene-containing low molecular weight defined compounds, thiophene-containing oligomers (with or without side chains, which affect the solubility) or polymers containing thiophene groups may be used, for example poly-3-hexylthiophene or compounds of the type $\alpha,\alpha'$-bis(2,2-dicyanovinyl)quinquethiophene (DCV5T), P3HT, (3-(4-octylphenyl)-2,2'bithiophene) (PTOPT), (PEOPT), (poly(3-(2'methoxy-5'-octylphenyl)thiophene))(POMeOPT), poly(3-octylthiophene) (P3OT), EHH-PpyPz, copolymers such as for example PTPTB or PCPDTBT (see for example Brabec C., Adv. Mater., 2006, 18, 2884) or poly[2,6-(4,4-bis-(2-ethylhexyl)-4H-cyclopenta[2,1-b;3,4-B']-dithiophene)-alt-4,7-(2,1,3-benzothiadiazole)].

Derivatives and oligomers or polymers of paraphenylene vinylene may furthermore be used as donor materials. In particular oligomers or polymers containing paraphenylene vinylene are envisaged here, for example polyparaphenylene vinylene (PPV), poly(2-methoxy-5-(2'ethylhexyloxy)-1,4-phenylene vinylene (MEH-PPV), poly(2-methoxy-5-(3',7'-dimethyloctyloxy)-1,4-phenylene vinylene) (MDMO-PPV), and CN-PPV, optionally with various alkoxy derivatives, PPE-PPV or also hybrid polymers.

Polyfluorenes and alternating polyfluorene copolymers may furthermore be used, for example copolymers width 4,7-dithien-2'-yl-2,1,3-benzothiadiazole, as well as F8BT (a polyfluorene copolymer) and/or PFB.

Furthermore, (2,7) and (3,6)polycarbazoles or oligomers and polymers containing carbazole may also be used.

Furthermore, (2,7) and (3,6)polyanilines and/or oligomers and polymers containing polyaniline may also be used.

Compounds of the triaryl amine class may also be used, such as TPD (triphenyl diamine) or spiro-MeOTAD, or similar compounds, benzidine derivatives, CBP, polytriaryl amines, polycyclopentadienes, polypyrroles, polyfurans, polysiloles, polyphospholes.

Rylene derivatives may also be used, so long as they present donor properties due to corresponding substituents.

Furthermore, fullerenes may again be used, for example $C_{60}$ and its derivatives, for example [6,6]-phenyl-$C_{61}$ butyric acid methyl ester (PCBM). In this case, the fullerene derivative would be used as a hole conductor.

Copper(I) iodide and copper(I)thiocyanate may furthermore be used.

The donor materials and/or the acceptor materials may also be present or used in doped form. Examples of p-dopants are in particular $Br_2$, $WO_3$, $MoO_3$, F4-TCNQ (tetra-fluoro-7,7,8,8-tetracyanoquinodimethane). Examples of n-dopants are in particular Cs, $Cs_2CO_3$, pyronin B.

As described above, mixed p-n materials may furthermore be used, in particular as an interlayer. Donor material and acceptor material may thus be present in a single material, i.e. for example in a monomer, oligomer, polymer, a block polymer, a polymer with $C_{60}$s, $C_{60}$-azo dye, carotenoid-porphyrin-quinone triads. Liquid crystal donor-acceptor systems may furthermore be used, such as described for example in Kelly, S., Adv. Mater. 2006, 18, 1754.

Optional Blocking Layer

It is furthermore preferable for the organic solar cell to comprise at least one blocking layer. Such a blocking layer may, for example, prevent the materials from mixing (when the layers are being applied or later during operation of the element) and thus degrading the component properties. In the scope of the present invention, it is preferable to introduce at least one such blocking layer between an electrode material, in particular an electrode material of the second electrode (for example the top electrode) and a further material of the organic solar cell. For example, the blocking layer may be introduced between the second electrode and a donor (p-type absorber, p-type semiconductor) of the organic solar cell, particularly in order to prevent electrode materials from penetrating into the donor material. Such effects and blocking layers are known, for example, from WO 02/101838. Possible materials for such a blocking layer, in particular an exciton blocking layer, or hole transport layer, are, for example, one or more of the following materials: N,N'-di-1-naphthyl-N,N'-diphenyl-1,1'-biphenyl-4,4'-diamine (NPD), N,N'-diphenyl-N,N'-bis(m-tolyl)benzidine (TPD), N,N'-bis-(1-naphthyl)-N,N'-diphenyl-1,1'-biphenyl-4-4'-diamine (NPB), 4,4',4''-tris(N-3-methylphenyl-N-phenylamino)triphenylamine (MTDATA), a diphenylbenzimidazolecarbene-iridium complex ($Ir(DPBIC)_3$), spiro-MeOTAD; a benzidine derivative, in particular α-NPD. It is also possible in principle to use other materials. Since these materials are partially transparent, they can also be used as "optical spacers" between the solar cell and the top electrode.

Second Electrode

A plurality of concepts known from the prior art may likewise be used as the second electrode, which may in particular be configured as a top electrode (see the above-described example of a preferred structure). Examples of such top electrodes are mentioned in WO 02/101838 (in particular pp. 18-20).

In particular metal electrodes may be used, which may comprise one or more metals in pure form or as a mixture/alloy, in particular aluminum or silver. It is also possible to use inorganic/organic mixed electrodes or multilayer electrodes, for example to use LiF/Al electrodes.

It is furthermore possible to use electrode concepts in which the quantum efficiency of the components is increased by forcing the photons to travel at least two times through the absorbing layers by appropriate reflections. Such layer structures are referred to as "concentrators", and they are likewise described in WO 02/101838 (particularly pp. 23-24).

Besides the described tandem solar cell in one of the embodiments presented, a method for producing a photovoltaic element is also provided. This method may in particular be used to produce a photovoltaic element in one of the embodiments described above. In particular, the above-proposed materials and layers and particular configurations of the photovoltaic element according to the dependent claims of the invention may be transposed into corresponding optional and preferred method steps, which may be used according to the invention as particular embodiments of the proposed method. It should however be pointed out that photovoltaic elements according to the invention may also be produced by methods other than the proposed production method, so that no restrictions concerning the configuration of the proposed photovoltaic element may generally be inferred from the production method.

The method according to the invention comprises the following steps, although they need not necessarily be carried out in the order presented. Additional method steps may furthermore be carried out, for example method steps to produce the above-described preferred particular configurations of the photovoltaic element. Individual method steps or several method steps may also be carried out chronologically in parallel or so that they chronologically overlap, and/or they may be repeated several times.

The method steps of the proposed method are:

a dye solar cell is produced, the following steps being carried out:
   at least one n-type semiconducting metal oxide is applied onto a first electrode (118);
   at least one dye absorbing electromagnetic radiation in a first spectral range is applied onto the n-type semiconducting metal oxide;
   at least one solid p-type semiconductor is applied onto the n-type semiconducting metal oxide;

an organic solar cell is produced, the organic solar cell being configured to absorb electromagnetic radiation in a second spectral range, which is at least partially different to the first spectral range, the following steps being carried out:
   at least one acceptor material is applied onto the dye solar cell;
   at least one donor material is applied onto the dye solar cell;
   at least one second electrode is applied onto the opposite side from the dye solar cell, the first electrode and/or the second electrode being at least partially transparent for the electromagnetic radiation.

As described above, it is also possible for individual process steps to be combined completely or partially. For example, in the production of the dye solar cell, as described above, the preparation steps of application of the dye and application of the p-type semiconductor can also be combined, for example by using an appropriate absorbent dye or a pigment.

Further details and features of the invention may be found in the following description of preferred examples in conjunction with the dependent claims. The respective features may be implemented separately, or several of them may be implemented in combination with one another. The invention is not restricted to the examples.

The examples are schematically represented in the figures. References which are the same in the individual figures denote elements which are the same or have the same function, i.e. they correspond to one another in respect of their function.

Specifically:

EXAMPLE 1

Figure 1:
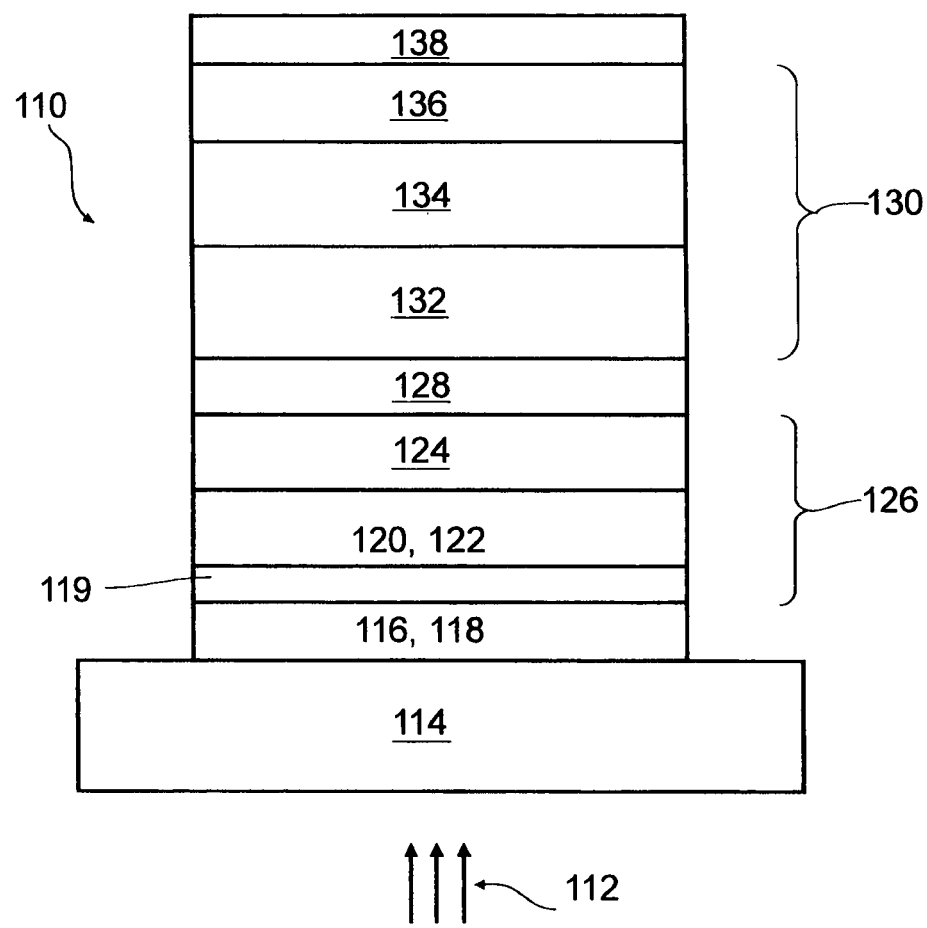
FIG. 1 shows a structure of a first example of a tandem solar cell according to the invention.

FIG. 1 represents a first example of a tandem solar cell 110. The tandem solar cell 110 comprises a support 114 which is essentially transparent for light 112 (preferably solar radiation). As already partly mentioned above, this support 114 may for example be a glass substrate, a transparent plastic substrate (for example a polyethylene sheet, a PET sheet, a PTFE sheet or other types of plastics) or laminates of such materials or other materials. It should be pointed out that in structures other than the exemplary structure represented in FIG. 1, for example a structure in which the solar incidence in FIG. 1 takes place from above, a transparent support 114 might not be necessary so that other types of supports could also be employed for this. In the example represented in FIG. 1, however, the transparency of the support 114 is required.

In this example, a transparent conducting oxide (TCO) 116 is applied onto the support 114. It will be assumed below that this TCO 116 in this example is FTO (fluorine-doped tin oxide). This TCO 116 therefore forms the first electrode 118 of the tandem solar cell 110 in the example represented in FIG. 1. In order to use the tandem solar cell 110, this first electrode 118 may for example be contacted via corresponding electrode contacts (not shown in FIG. 1).

Optionally a buffer layer 119, which at least substantially prevents holes from reaching the first electrode 118, is initially applied onto the first electrode 118. It will be assumed below that a single layer of a (preferably not nanoporous) titanium dioxide is used here as the buffer layer 119. This buffer layer preferably has a thickness which (in this or other examples of the present invention) may lie between 10 nm and 500 nm. Such layers may, for example, be produced by sputtering and/or spray pyrolysis.

An n-type semiconducting metal oxide 120, which is sensitized according to the above description with a dye 122, is applied onto the buffer layer 119. It will be assumed below that this n-type semiconducting metal oxide 120 is titanium dioxide, but without thereby restricting the scope of the invention.

A solid p-type semiconductor 124 is applied onto the n-type semiconducting metal oxide 120 sensitized with the dye 122. For possibilities regarding the configuration and material selection for this p-type semiconductor material 124, reference may be made to the following examples.

The n-type semiconducting metal oxide 120 with its sensitization by the dye 122 and the layer of p-type semiconductor 124 together form a dye solar cell 126, which functions here as a lower subcell of the tandem solar cell 110.

In the preferred example represented by FIG. 1, this dye solar cell 126 is followed by a charge recombination zone 128. This charge recombination zone 128 may for example be configured as a floating electrode (i.e. an electrically uncontacted electrode), and in this context constitutes the top electrode for the dye solar cell 126 and simultaneously the bottom electrode for the adjacent organic solar cell 130 (see description below). This representation illustrates particularly that the preferred example shown in FIG. 1 is a two-contact tandem solar cell.

This charge recombination zone 128, which as described above may also be produced in the form of a defect zone in one of the adjoining layers, for example in the form of a defect zone inside the uppermost layer of p-type semiconductor 124, is followed in the example represented in FIG. 1 by an organic solar cell 130. This organic solar cell 130 forms the second subcell of the tandem solar cell 110, and preferably absorbs the light 112 in a longer-wave wavelength range. The absorption range is preferably selected to be complementary with the absorption range of the dye solar cell 126.

The organic solar cell 130 firstly comprises an acceptor material 132 as an n-type semiconducting layer. This acceptor material 132 is followed by a donor material 134 as a p-type semiconducting layer. At least one of the layers 132 or 134 must have absorbing properties for the light 112 in the example represented in FIG. 1. The terms "n-type absorber" 132 or "p-type absorber" 134 may correspondingly be used. In the structure shown in FIG. 1, the acceptor material 132 and the donor material 134 are shown as separate layers. As mentioned above, however, this merely represents one option for producing the organic solar cell 130. Mixed layers of acceptor and donor materials are also possible, for example in the scope of a single layer and/or in the scope of an acceptor material layer, a donor material layer and a mixed layer between them (i.e. an n-bulk heterojunction-p layer structure) or complete bulk heterojunctions may also be produced, i.e. structures in which acceptor material 132 and donor material 134 engage in one another along a very uneven interface inside a wide boundary region (up to a few micrometers). As an alternative or in addition to said possibilities, it is furthermore possible to use a plurality of acceptor materials 132 and/or a plurality of donor materials 134 respectively, which may in turn be employed as separate layers and/or as mixed layers. As is moreover conventional, all layers and materials may be used both in a pure undoped form and in a doped form.

In the example represented in FIG. 1, the donor material 134 is followed by an (optional) blocking layer 136. A second electrode 138, which can function as the second electrode of the two-contact tandem solar cell 110 embodied here, is applied as a top contact onto this blocking layer 136. Accordingly, this second electrode 138 may be contacted by corresponding electrode contacts so that the photovoltage can be drawn off between the first electrode 118 and the second electrode 138. In the example represented in FIG. 1, the blocking layer 136 serves in particular to prevent material of the second electrode 138 from being able to penetrate into the layer of donor material 134.

Figure 2:
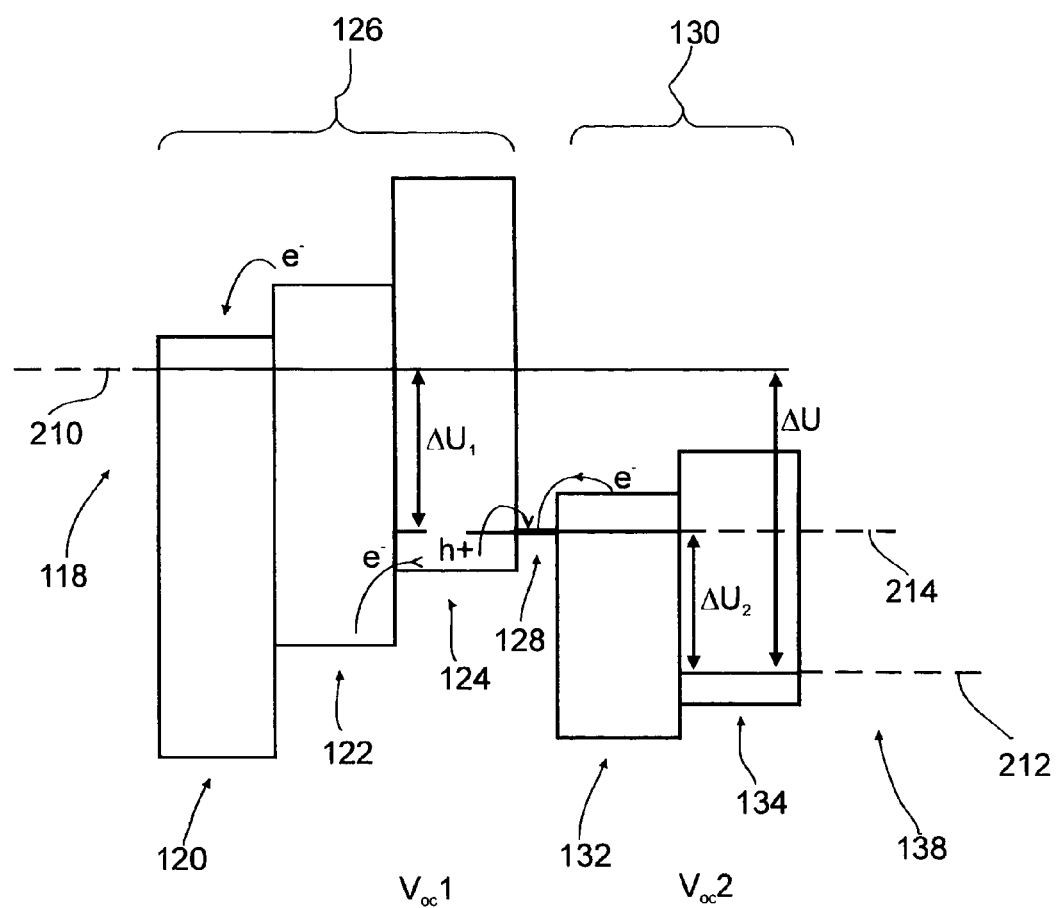
FIG. 2 shows a simplified level diagram of the tandem solar cell represented in FIG. 1.

FIG. 2 represents a level diagram of the layer structure of the tandem solar cell 110 as shown in FIG. 1. For the sake of simplicity the blocking layer 136, which in the ideal case would not fulfill any essential electrical function, has been omitted.

The first electrode 118 and the second electrode 138 are identified in the structure shown in FIG. 2 by their Fermi level 210 and 212. The level of the uncontacted charge recombination zone which may for example comprise a floating metal electrode, and which therefore corresponds approximately to the vacuum level, is denoted by 214 in FIG. 2.

The individual levels of the layers of the dye solar cell 126 and of the organic solar cell 130 are also respectively indicated symbolically in FIG. 2. The lower horizontal edge of a rectangle respectively denotes the level of the valence band of the corresponding layer (if it is an inorganic semiconductor) or, in the molecular orbital model, the level of the highest occupied molecular orbital (HOMO). The upper horizontal edges of each rectangle denote the energy position of the conduction band or (in the molecular orbital model) the level of the lowest unoccupied molecular orbital (LUMO).

The functionality of the tandem solar cell 110 as already described above can be recognized from the level diagram represented in FIG. 2. Thus photons of the light 112 at a first wavelength are absorbed in the dye 122, so that excited molecular states are formed in the dye 122. They release an electron into the conduction band of the n-type semiconducting metal oxide 120, from where it can flow out of this to the first electrode 118.

For charge equilibration of the dye 122, the p-type semiconductor material 124 transfers electrons to the dye 122 so that holes are formed in the p-type semiconductor 124. These are in turn compensated for at the charge recombination zone 128. The transport of holes ($h^+$) and electrons ($e^-$) leads to a potential difference $\Delta U_1$ between the charge recombination zone 128 and the first electrode 118, which corresponds to a photovoltage $V_{OC}1$ of the dye solar cell 126. If the solar cell structure were to comprise only the dye solar cell 126, then this would be the voltage extractable at the electrode contacts.

As described above, however, the tandem solar cell 110 furthermore comprises the organic solar cell 130. Photons with a second, longer wavelength of the light 112 are absorbed in this organic solar cell 130. The wavelength of the absorbed light depends on the properties of the acceptor material 132 and/or of the donor material 134, in particular their bandgaps. Excitons are thereby formed in the acceptor material 132 and/or in the donor material 134, and these decay into electrons and holes at the junction between the materials 132, 134. The electrons migrate to the charge recombination zone 128, and the holes to the second electrode 138. A potential difference $\Delta U_2$ is thereby formed between the second electrode 138 and the charge recombination zone 128, which corresponds to a photovoltage $V_{OC}2$. This photovoltage $V_{OC}2$ would be the photovoltage extractable at the open electrode contacts of the solar cell if it were to comprise only the organic solar cell 130.

Overall, so long as the electrodes 118 and 138 are separated and no current flows through the tandem solar cell 110, the total photovoltage of the tandem solar cell 110 is therefore given by the sum of the two photovoltages $V_{OC}1$ and $V_{OC}2$.

Figure 3A:
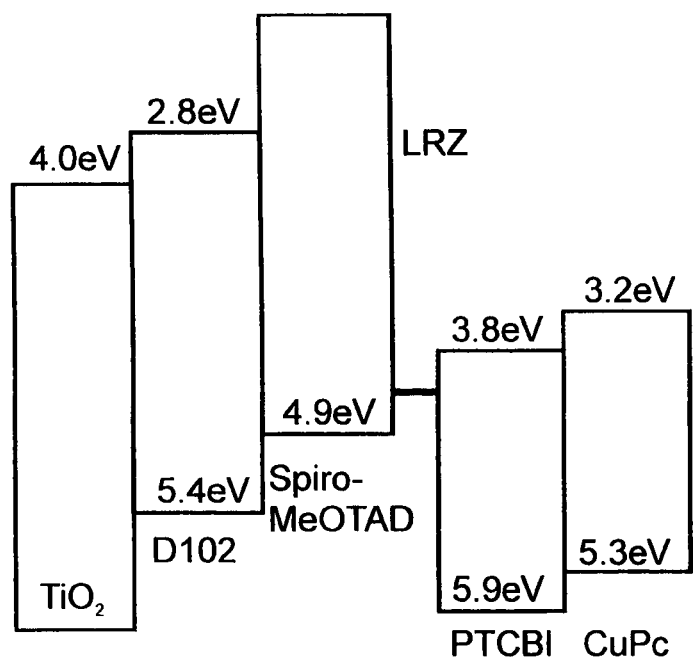
FIGS. 3A to 3E show various examples of material combinations for the tandem solar cell represented in FIG. 1.

In order to test the novel tandem cell concept, tandem solar cells 110 with a layer structure configured similarly as in FIGS. 1 and 2 were produced as follows. The layer structure is represented in FIG. 3A.

Glass plates coated of size 25 mm×15 mm×3 mm (Nippon Sheet Glass) coated with fluorine-doped tin oxide (FTO) were used as the base material, which were successively treated with glass cleaner (RBS 35), fully deionized water and acetone, in each case for 5 min in an ultrasonic bath, then baked for 10 minutes in isopropanol and dried in a nitrogen flow.

A sputtering method was used to produce the solid $TiO_2$ buffer layer 119. Other methods may however also be used as an alternative or in addition, for example spray pyrolysis methods. A $TiO_2$ paste (manufacturer Catalysts & Chemicals IND. CO., LTD (CCI)), which contains $TiO_2$ particles with a diameter of 25 nm in a dispersion, was spin-coated thereon with a spin coater at 4500 rpm and dried for 30 min at 90° C. After heating to 450° C. for 45 minutes and a 30 minute sintering step at 450° C., a $TiO_2$ layer thickness of approximately 0.5 μm was obtained, although this was not confirmed by a measurement.

For removal of the electrical insulation of the metal back electrodes from the working electrode, a strip of polyimide (pyrroline polyimide coating, manufacturer Supelco) was respectively applied lengthwise onto the edges of the $TiO_2$ layer and cured for 15 min at 200° C. in a drying cabinet.

After removal from the drying cabinet, the specimen was cooled to 80° C. and immersed for 12 h in a $5\times10^{-4}$ mM solution of a dye in MeCN/t-BuOH 1:1. The dye D102, as is described in Schmidt-Mende et al., Adv. Mater. 2005, 17, 813, was used as the dye in this case. After removal from the solution, the specimen was subsequently washed in the same solvent and dried in a nitrogen flow. The specimens produced in this way were subsequently vacuum-dried at 40° C.

A p-type semiconductor solution was spin-coated on next. To this end a 0.16 M spiro-MeOTAD (Merck, SHT-263), 15 mM $LiN(SO_2CF_3)_2$ (Aldrich), 0.12 M 4-t-butylpyridine (Aldrich) solution in chlorobenzene was employed. 150 μl of this solution were applied onto the specimen and allowed to act for 60 s. The supernatant solution was then spun off for 30 s at 2000 revolutions per minute and it was dried for 4 h at 40° C. in a vacuum oven.

A thin charge recombination zone was subsequently applied. To this end Ag was evaporated by thermal metal evaporation in a vacuum at a rate of 0.1 nm/s in a pressure of $5*10^{-5}$ mbar, so that an approximately 1 nm thick Ag layer was obtained. Such a layer still has good transparency properties in the visible spectral range.

Further active organic layers were vapor deposited thereon in the following order. First perylene-tetracarboxylic acid-bis-benzimidazole (PTCBI, gradient-sublimed two times) as an isomeric mixture was applied as the acceptor material, and then copper phthalo-cyanine (CuPc, gradient-sublimed once) as the donor material. A blocking layer 136 was not used in this example, although it is optionally possible. Operation was carried out at a pressure of $8*10^{-6}$ mbar. The evaporation of PTCBI took place at a temperature of 440° C. and with a vapor deposition rate of 0.2-1.0 nm/s, and CuPc was vapor deposited at 380° C. with a vapor deposition rate of 0.2-1.0. The resulting layer thicknesses were 50 nm for the PTCBI layer and likewise 50 nm for the CuPc layer.

The metal back electrode (second electrode) was applied in a vacuum by thermal metal evaporation. To this end, the sample was provided with a mask in order to evaporation-coat 4 mutually separated rectangular back electrodes with dimensions of about 4 mm×3 mm onto the active region, each of which was connected to an approximately 3 mm×2 mm large contact surface over the polyimide layer described above. Au was used as the metal, which was evaporated with a rate of 0.2-1.0 nm/s at a pressure of about $5*10^{-5}$ mbar so that a layer thickness of about 50 nm was obtained.

In order to determine the efficiency η, the respective current/voltage characteristic was measured with a Source Meter Model 2400 (Keithley Instruments Inc.) under exposure to a halogen lamp array (Xenophot® 64629; Osram) as a solar simulator.

Figure 4:
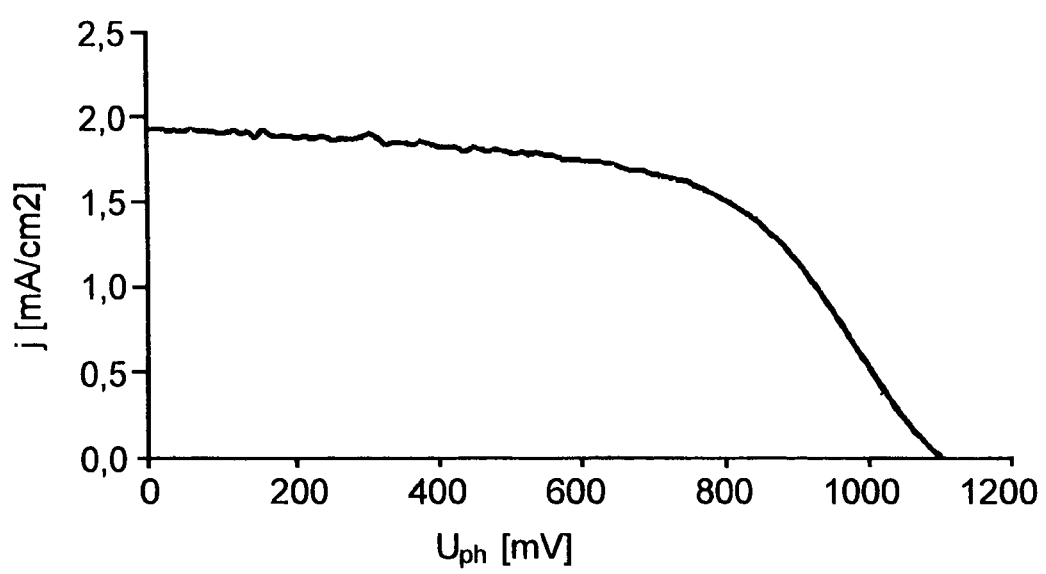
FIG. 4 shows a voltage-current characteristic of an example of a tandem solar cell according to the invention, having a structure according to FIG. 3A.

A current/voltage characteristic with an illumination strength of 100 mW/cm² was obtained, which is shown in FIG. 4. The photovoltage $U_{ph}$ is plotted in mV on the abscissa, such that the load on the tandem a solar cell 110 increases toward the right on this axis. The measured current density j is plotted in mA/cm² on the ordinate.

The short circuit current (i.e. the current density with a load resistance of zero) was 1.93 mA/cm², and the open circuit voltage $V_{OC}$ (i.e. the load with which the current density has decreased to zero) was 1103 mV, the fill factor was 57% and the efficiency was 1.2%

FIGS. 3B to 3E represent alternative examples to FIG. 3A. In the structure represented in FIG. 3B, the PTCBI of the acceptor material 132 is replaced by the material QDI. The acceptor material QDI (quaterrylene diimide) is known for example from K. Müllen et al., Chem. Mater. 18, 3715-3725 (2006) (referred to therein as "Compound 3").

Figure 3B:
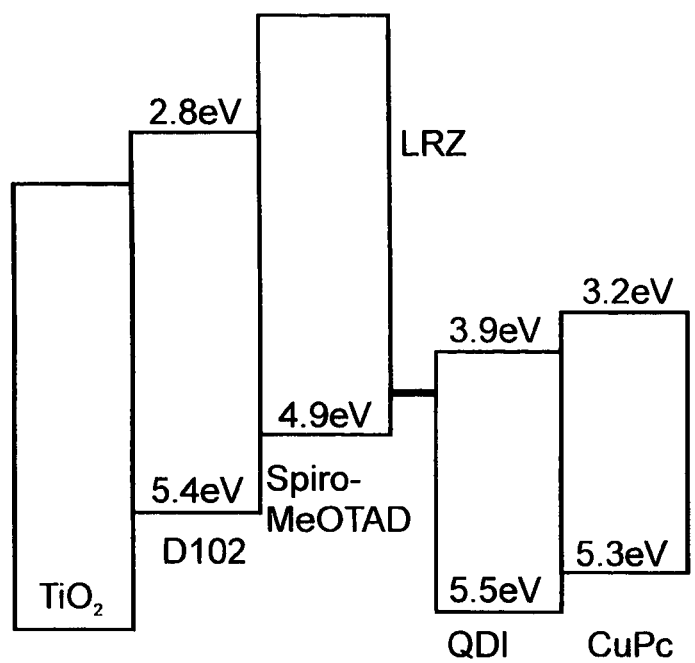
Figure 3C:
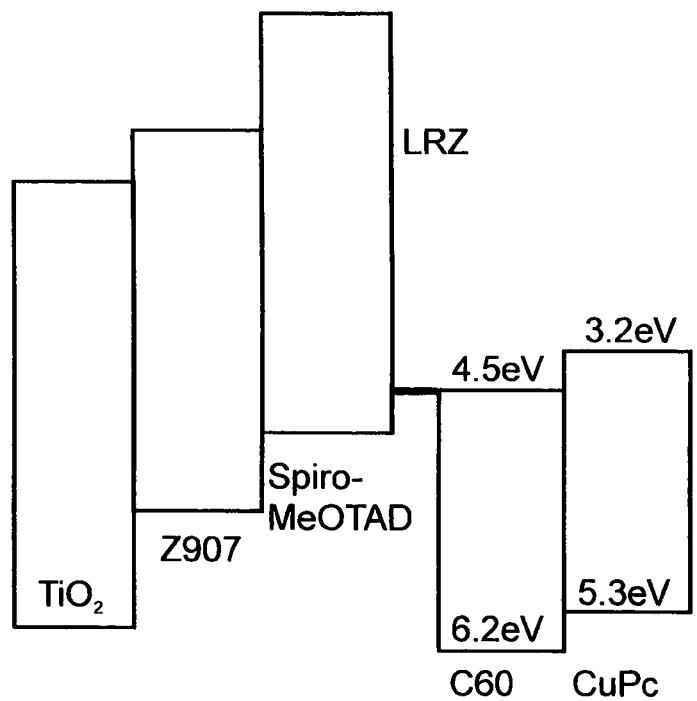

As the dye 122 in FIG. 3C, compared to the structure in FIG. 3B, the dye D102 is replaced by the dye Z907 (see in this regard M. Grätzel et al., Appl. Phys. Lett. 86, 013504 (2005)). Furthermore, QTCBI or QDI is replaced by the fullerene C60 as the acceptor material 132.

Figure 3D:
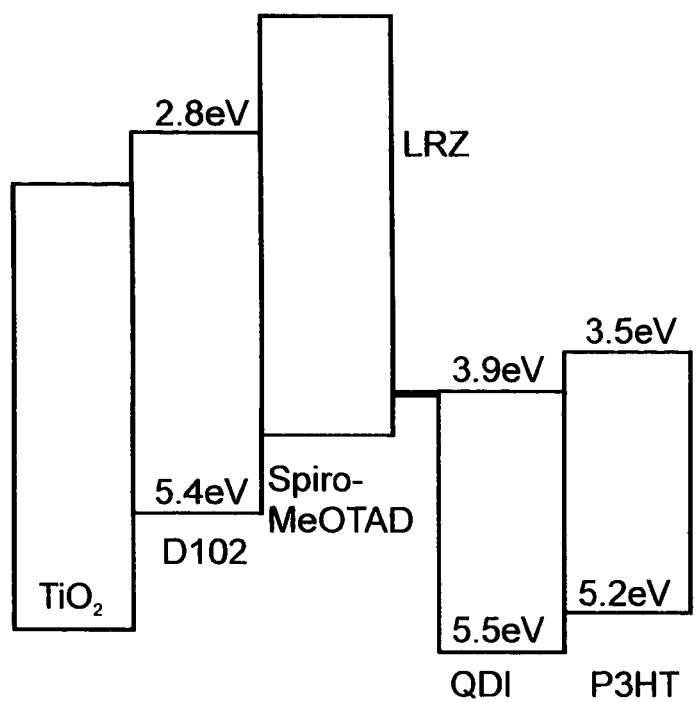

FIG. 3D in turn represents a modification of the layer structure in FIG. 3B in this case, compared with the structure in FIG. 3B, CuPc is replaced by P3HT as the donor material 134.

Figure 3E:
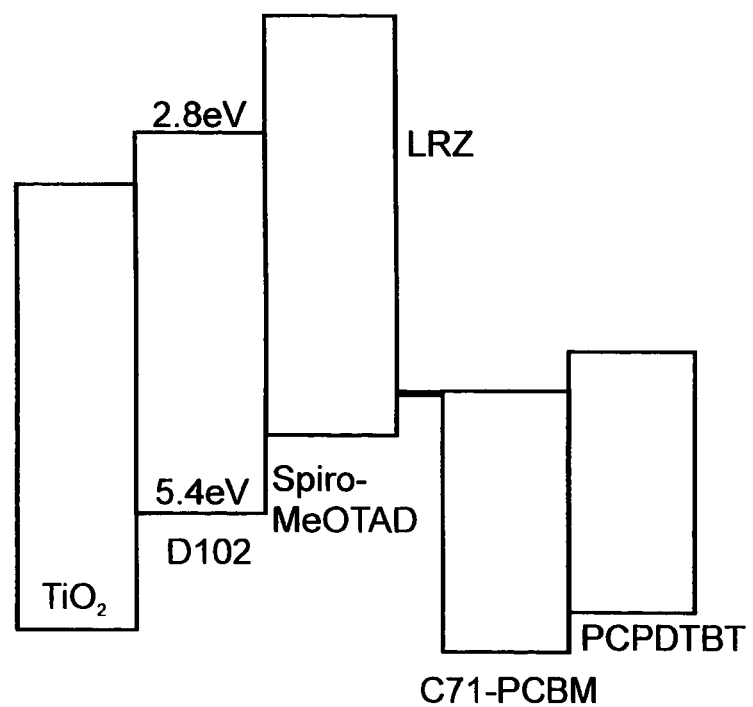

FIG. 3E corresponds to the structure in FIG. 3D, although QDI is replaced by C71-PCBM as the acceptor material 132 and P3HT is replaced by PCPDTBT as the donor material.

In all cases the HOMO and LUMO levels in electron volts (eV) are respectively indicated for the solar cell 110, so long as they are known. The charge recombination zone 128 is denoted by LRZ in FIGS. 3A to 3E.

EXAMPLE 2

Figure 5:
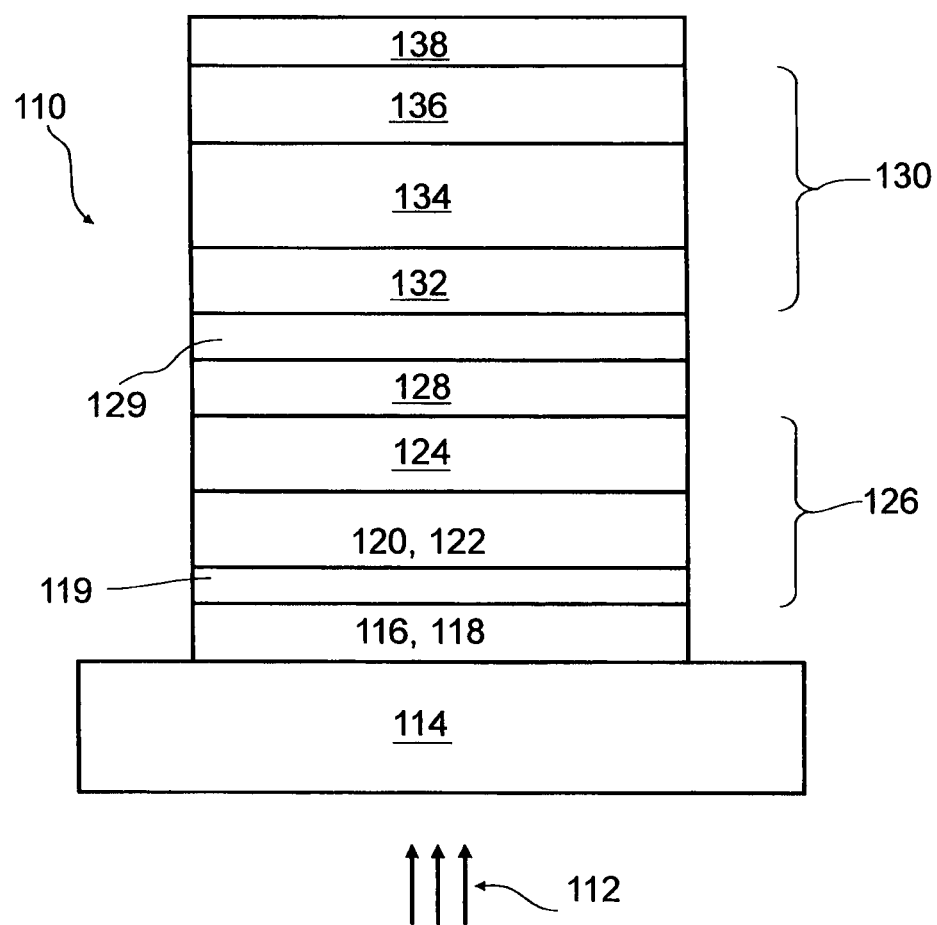
FIG. 5 shows a structure of a second example of a tandem solar cell according to the invention.
Figure 6:
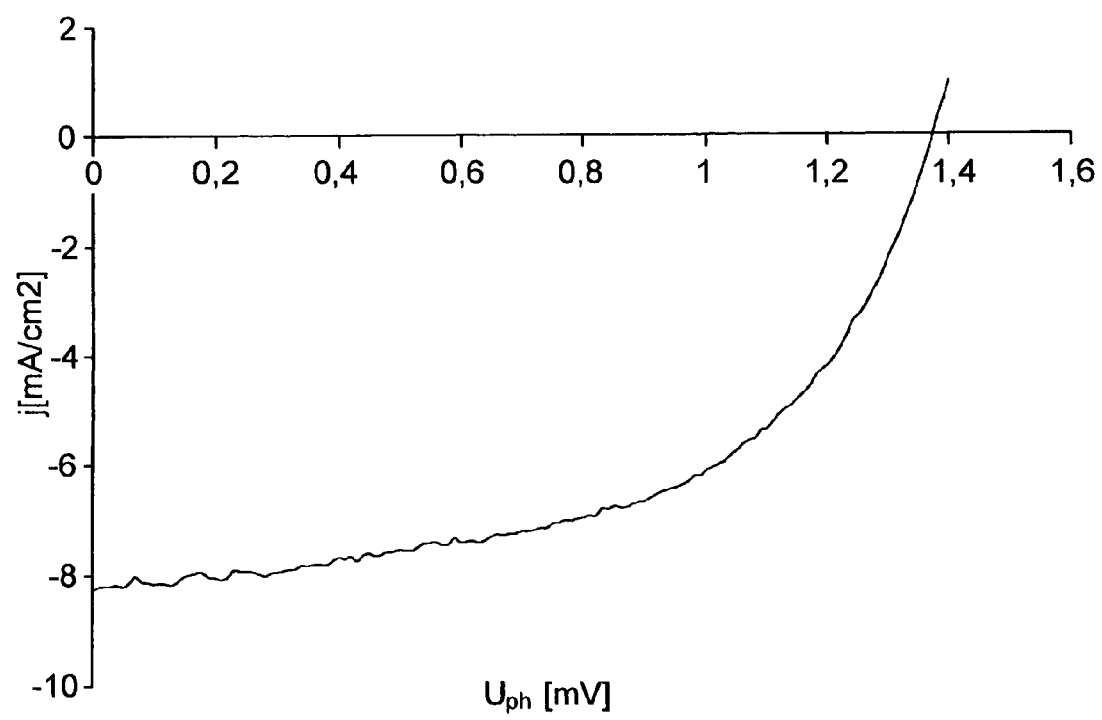
FIG. 6 shows a voltage-current characteristic of the example according to FIG. 5.

FIGS. 5 and 6 show a further example of an inventive tandem solar cell 110. FIG. 5 shows a schematic diagram of the layer structure analogous to FIG. 1. FIG. 6 shows test data of this structure, similarly to the diagram in FIG. 4.

The layer structure shown in FIG. 5 corresponds at first substantially to the layer structure according to FIG. 1, and so reference can be made substantially to the description of FIG. 1 for the function of the layers shown. The material selection and the production of the layer sequence is described below. A significant difference of the layer structure in the example according to FIG. 5 from FIG. 1 is that an electron transport layer 129 has been inserted between the charge recombination zone 128 and the organic solar cell 130, here the acceptor material 132 of the organic solar cell 130, in order to improve electrical coupling of the charge recombination zone 128 to the organic solar cell 130.

The layer structure shown in FIG. 5 was produced as follows.

The base material used, i.e. the support 114 and the TCO layer and first electrode 118 used, were fluorine-doped, tin oxide (FTO)-coated glass plates of dimensions 25 mm×15 mm×3 mm (Nippon Sheet Glass), which were treated successively with glass cleaner (RBS 35), demineralized water and acetone in an ultrasound bath for 5 min each, then boiled in isopropanol for 10 minutes and dried in a nitrogen stream.

Analogously to FIG. 1, an optional buffer layer 119 was again also used in the form of a solid $TiO_2$ buffer layer. To produce this solid $TiO_2$ buffer layer 119, a spray pyrolysis method was used.

In turn, a layer of an n-type semiconducting metal oxide 120 was applied to the buffer layer 119. For this purpose, a $TiO_2$ paste (Dyesol, DSL 18NR-T) was applied by spin-coating with a spin-coater at 4500 revolutions per minute and dried at 90° C. for 30 min. Heating to 450° C. for 45 minutes and a 30-minute sintering step at 450° C. resulted in a $TiO_2$ layer thickness of approximately 1.8 μm.

The intermediates produced in this way were then optionally treated with $TiCl_4$, as described by Grätzel, for example, in Grätzel M. et al., Adv. Mater. 2006, 18, 1202.

A strip of polyimide (pyroline polyimide coating, manufacturer: Supelco) was applied in each case to the longitudinal edges of the $TiO_2$ layer for electrical insulation of the second electrode 138 (metal back electrode) to be applied later from the first electrode 118 (working electrode), and cured in a drying cabinet at 200° C. for 15 min.

For application of the dye 122, the sample, after removal from the drying cabinet, was cooled to 80° C. and immersed into a $5\times10^{-4}$ mM solution of the dye in 1:1 MeCN/t-BuOH for 2 h. The dye 122 used was the dye D102 as described in Schmidt-Mende et al., Adv. Mater. 2005, 17, 813. After removal from the solution, the sample was subsequently rinsed with the same amount of solvent and dried in a nitrogen stream. The samples obtained in this way were then dried at 40° C. under reduced pressure.

To obtain the p-semiconductor layer 124, a p-semiconductor solution was next applied by spin-coating. To this end, a 0.12 M spiro-MeOTAD (Merck, SHT-263), 15 mM LiN$(SO_2CF_3)_2$ (Aldrich), 0.06M 4-t-butylpyridine (Aldrich) solution in chlorobenzene was made up. 75 μl of this solution were applied to the sample and allowed to act for 60 s. Thereafter, the supernatant solution was spun off at 2000 revolutions per minute for 30 s and stored in the dark overnight.

Thereafter, as also in the example according to FIG. 1, a thin charge recombination zone 128 was applied. To this end, Ag was evaporated by thermal metal evaporation under reduced pressure at a rate of 0.1 Ns at a pressure of $3\times10^{-6}$ mbar, so as to give rise to an Ag layer of thickness about 2 nm. Such a layer still had good transparency properties in the visible spectral range.

To this were applied further active organic layers in the following sequence. Thus, as described above, in the example according to FIG. 5, an electron transport layer 129 was inserted between the charge recombination zone 128 and the organic solar cell 130. For this purpose, a Bphen layer as an electron transport layer 129 with a layer thickness of 5 nm was first applied by vapor deposition at a rate of 0.7 Ns and a temperature of 140° C. to the silver layer which serves as the charge recombination zone 128. This Bphen layer acts as an exciton blocker for the next $C_{60}$ layer of the acceptor material 132 and ensures good electronic contact between the fullerenes and the charge recombination zone 128.

The Bphen layer of the electron transport layer 129 was followed by a $C_{60}$ layer which serves as an acceptable material 132 and electron conductor and has a layer thickness of 20 nm. This was applied by vapor deposition at a rate of 2 Ns and a temperature of 400° C.

There followed, as a donor material 134, a 40 nm-thick layer of coevaporated zinc phthalocyanine (ZnPc, double gradient sublimation), which served as the actual donor material (matrix), and the acceptor $C_{60}$. ZnPc was evaporated at 380° C. The vapor deposition rate of the two materials was 1 Ns. This coevaporated layer ensures an efficient conversion of the excitons at the junction between the acceptor material 132 and the donor material 134 to charge carriers. A pressure of $2\times10^{-6}$ mbar was employed.

The second electrode 138 applied was a metal back electrode by thermal metal evaporation under reduced pressure. The metal used was Ag, which was evaporated at a rate of 3 Ns at a pressure of approx. $2\times10^{-6}$, so as to give rise to a layer thickness of about 100 nm.

The tandem solar cell 110 obtained in this way was subsequently analyzed for its electrooptical properties. This is illustrated by the characteristic in FIG. 6 in which, analogously to FIG. 4, the current density j is again plotted against the photovoltage $U_{ph}$. The plot has been done here with a different sign to that in FIG. 4, which, however, is for analytical reasons and does not result from fundamental physical differences.

To determine the efficiency η, the particular current/voltage characteristic was measured with a source meter model 2400 (Keithley Instruments Inc.) with irradiation using a halogen lamp field (Xenophot® 64629; Osram) as a sun simulator.

The short circuit current (i.e. the current density with a load resistance of zero) was 8.25 mA/cm$^2$, and the open circuit voltage $V_{OC}$ (i.e. the load with which the current density has decreased to zero) was 1370 mV, the fill factor was 54% and the efficiency was 6.14%. These results show that the inventive construction leads to photovoltaic elements with high efficiency.

LIST OF REFERENCES 110 tandem solar cell
112 light
114 support
116 transparent conducting oxide, TCO
118 first electrode
119 buffer layer
120 n-type semiconducting metal oxide
122 dye
124 p-type semiconductor
126 dye solar cell
128 charge recombination zone
129 electron transport layer
130 organic solar cell
132 acceptor material
134 donor material
136 blocking layer
138 second electrode, top contact
210 Fermi level of first electrode
212 Fermi level of second electrode
214 vacuum level

The invention claimed is:

1. A photovoltaic element for converting electromagnetic radiation into electrical energy, the photovoltaic element having a tandem cell structure, wherein the tandem cell structure comprises:
   a dye solar cell having a first electrode, an n-type semiconducting metal oxide,
   a dye absorbing electromagnetic radiation in a first spectral range and a solid p-type semiconductor; and
   an organic solar cell having an acceptor material and a donor material, the acceptor material and/or the donor material comprising an organic material, the organic solar cell furthermore comprising a second electrode on an opposite side from the dye solar cell, and the organic solar cell being configured to absorb electromagnetic radiation in a second spectral range, which is at least partially different from the first spectral range,
   the first electrode and/or the second electrode being at least partially transparent for the electromagnetic radiation,
   wherein the photovoltaic element comprises at least one charge recombination zone between the dye solar cell and the acceptor material of the organic solar cell.

2. The photovoltaic element according to claim 1, wherein the tandem cell structure is a two-contact tandem cell structure, the photovoltaic element comprising a first electrical contact electrically connected to the first electrode, and a second electrical contact electrically connected to the second electrode.

3. The photovoltaic element according to claim 1, wherein the at least one charge recombination zone comprises at least one of the following materials: a metal selected from the group consisting of Ag, Au, Li, Al, Ti and Sn; a metal halide; a metal oxide; a doped metal oxide; a region doped with defects; and a highly doped p/n junction.

4. The photovoltaic element according to claim 1, wherein the at least one charge recombination zone has a layer thickness of less than 2.0 nm.

5. The photovoltaic element according to claim 4, wherein the layer thickness of the at least one charge recombination zone is 0.5 nm.

6. The photovoltaic element according to claim 1, wherein at least one electron transport layer is also introduced between the at least one charge recombination zone and the organic solar cell.

7. The photovoltaic element according to claim 6, wherein the at least one electron transport layer comprises one or more of the following materials: a triphenylene derivative; 1,3-bis(4-tert-butylphenyl-1,3,4-oxadiazoyl)phenylene (OXD7); 1,3-bis(4-(N,N-dimethylamino)phenyl-1,3,4-oxadiazoyl) phenylene (OXD8); 2-(1-naphthyl)-5-(p-tert-butylphenyl)-1,3,4-oxadiazole (t-Bu-PNF); a titanium oxide (TiOx); batho-phe-nanthroline (BPhen); 2,9-dimethyl-4,7-diphenyl-1,10-phenanthroline (BC P): 3-(biphenyl-4-yl)-4-phenyl-5-(4-tert-butylphenyl)-1,2,4-triazole (TAZ); and a ruthenium complex.

8. The photovoltaic element according to claim 1, wherein the organic solar cell comprises a transition between a layer of the acceptor material and a layer of the donor material, the layer of the acceptor material being arranged on a side facing the dye solar cell and the layer of the donor material being arranged on a side of the transition facing away from the dye solar cell.

9. The photovoltaic element according to claim 8, wherein the transition additionally comprises a mixed layer of the acceptor material and the donor material arranged between the layer of the acceptor material and the layer of the donor material.

10. The photovoltaic element according to claim 9, wherein at least one buffer layer comprising a buffer metal oxide is introduced between the first electrode and the n-type semiconducting metal oxide.

11. The photovoltaic element according to claim 10, wherein the buffer metal oxide comprises at least one of the following metal oxides: a vanadium oxide; a zinc oxide; a tin oxide; and a titanium oxide.

12. The photovoltaic element according to claim 10, wherein the at least one buffer layer has a thickness of between 10 nm and 200 nm.

13. The photovoltaic element according to claim 1, wherein the first electrode and/or the second electrode comprises at least one of the following materials: a metal foil; a metal film; a transparent conducting oxide; and carbon nanotubes.

14. The photovoltaic element according to claim 1, wherein one and only one of the first and second electrodes is at least partially transparent for the electromagnetic radiation, and wherein the other of the first and second electrodes is at least partially reflective for the electromagnetic radiation.

15. The photovoltaic element according to claim 14, wherein the first electrode is a transparent electrode.

16. The photovoltaic element according to claim 15, comprising a support which is at least partially transparent for the electromagnetic radiation, the first electrode being applied onto the support.

17. The photovoltaic element according to claim 1, wherein the n-type semiconducting metal oxide comprises at least one of the following materials: zinc oxide; tin dioxide; titanium dioxide; tin(IV) oxide; tungsten(VI) oxide; tantalum (V) oxide; nio-bium(V) oxide; cesium oxide; strontium titanate; zinc stannate; a complex oxide of the perovskite type; a binary iron oxide; and a ternary iron oxide.

18. The photovoltaic element according to claim 1, wherein the n-type semiconducting metal oxide comprises: anatase zinc oxide; anatase titanium dioxide, or a combination thereof.

19. The photovoltaic element according to claim 1, wherein the n-type semiconducting metal oxide comprises at least one n-type semiconducting metal oxide in nanoparticulate or amorphous form.

20. The photovoltaic element according to claim 1, wherein the n-type semiconducting metal oxide comprises at least one nanoporous layer.

21. The photovoltaic element according to claim 1, wherein the n-type semiconducting metal oxide comprises at least one mixture of two n-type semiconducting metal oxides.

22. The photovoltaic element according to claim 1, wherein the n-type semiconducting metal oxide comprises at least one first metal oxide, which is coated with at least one second metal oxide.

23. The photovoltaic element according to claim 1, wherein the n-type semiconducting metal oxide comprises at least one metal oxide which is coated onto a non-oxidic semiconductor material selected from the group consisting of GaP, ZnP, and ZnS.

24. The photovoltaic element according to claim 23, wherein the semiconductor material comprises at least one of the following materials: GaP, ZnP, and ZnS.

25. The photovoltaic element according to claim 1, wherein the dye comprises at least one of the following sensitizer materials: a transition metal complex; an indoline compound; a cyanine compound; a merocyanine compound; an oxazine compound; a thiazine compound; an acridine compound; a porphyriuxpound; a rylene derivative; a perylene compound; a terrylene compound and a quaterrylene compound.

26. The photovoltaic element according to claim 1, wherein the dye exhibits absorption in a range of between 400 nm and 700 nm.

27. The photovoltaic element according to claim 1, wherein the dye solar cell comprises a passivation material between the n-type semiconducting metal oxide and the p-type semiconductor, which is adapted to at least partially prevent electron transfer between the n-type semiconducting metal oxide and the p-type semiconductor.

28. The photovoltaic element according to claim 27, wherein the passivation material comprises at least one of the following materials: $Al_2O_3$; an aluminum sail; a silane; an organometallic complex; $Al^{3+}$; a 4-tert-butylpyridine; MgO; 4-guanidinobutyl acid (GBA); an alkyl acid; and hexadecylmalonic acid.

29. The photovoltaic element according to claim 1, wherein the p-type semiconductor comprises at least one of the following materials: an inorganic solid; a conducting organic material; and an organic p-type semiconductor.

30. The photovoltaic element according to claim 1, wherein the acceptor material comprises at least one of the following materials: a rhodamine; a triphenyl methane; a fullerene; a chemically modified fullerene; a nanotube material; a nanorod material; a quantum dot material based on at least one of the following substances: CdSe, CdTe, CdS, HgTe, PbS, and $CuInS_2$; an inorganic semiconductor material in the form of nanoparticles or nanorods; an n-type semiconducting polymer; a rylene diimide dye; a rylene monoimide compound; and a bisimidazole derivative, all of said materials being entirely or partially present in pigmented form or in the form of liquid crystalline derivatives.

31. The photovoltaic element according to claim 1, wherein the donor material comprises at least one of the following materials: a pentacene; a phthalocyanine; a subphthalocyanine; a phthalocyanine compound; a porphyrin compound; a merocyanine compound; a liquid crystal material; a thiophene; a low molecular weight compound containing thiophene; an oligomer containing thiophene; a polymer containing thiophene groups; a polymer based on p-phenylene-vinylene; an oligomer based on p-phenylene-vinylene; a polyfluorene; an alternating polyfluorene copolymer; a polycarbazole; an oligomer containing carbazole; a polymer containing carbazole; a polymer based on polyaniline; an oligomer containing aniline; a polymer containing aniline; a compound of the triaryl amine class; a compound of the polytriarylamine class; a compound of the polycyclopentadiene class; a compound of the polypyrrole class; a compound of the polyfuran class; a compound of the polysilole class; a compound of the polyphosphole class; a benzidine derivative; a carbazole; a spiro compound; a rylene derivative; a fullerene or a fullerene derivative; copper(1) iodide; and copper(1) thiocyanate.

32. The photovoltaic element according to claim 1, wherein the organic solar cell comprises at least one mixed p-n material selected from one of the following materials: a polymer; a polymer-fullerene compound and a polymer-fullerene mixture.

33. The photovoltaic element according to claim 1, wherein the organic solar cell exhibits absorption which lies in the range of between 600 nm and 1000 nm.

34. The photovoltaic element according to claim 1, wherein the organic solar cell comprises at least one blocking layer, the at least one blocking layer being arranged between the second electrode and at least one further material of the organic solar cell comprising at least one of the following hole-conducting materials: an NPD; TPD; NPB; MTDATA; DPBIC; spiro-MeOTAD; and a benzidine derivative.

35. A method for producing a photovoltaic according to claim 1, wherein the method comprises producing a dye solar cell by:
  applying at least one n-type semiconducting metal oxide onto a first electrode;
  applying at least one dye absorbing electromagnetic radiation in a first spectral range onto the n-type semiconducting metal oxide; and
  applying at least one solid p-type semiconductor onto the n-type semiconducting metal oxide; and
producing an organic solar cell, the organic solar cell being configured to absorb electromagnetic radiation in a second, spectral range, which is at least partially different from the first spectral range, said organic solar cell being produced by:
  applying at least one acceptor material onto the dye solar cell;
  applying at least one donor material onto the dye solar cell; and
  applying at least one second electrode onto the opposite side from the dye solar cell, the first electrode and/or the second electrode being at least partially transparent for the electromagnetic radiation, wherein the photovoltaic element comprises the at least one charge recombination zone between the dye solar cell and the acceptor material of the organic solar cell.

* * * * *